(12) United States Patent
Iizuka et al.

(10) Patent No.: US 10,981,250 B2
(45) Date of Patent: Apr. 20, 2021

(54) WAFER PRODUCING APPARATUS

(71) Applicant: DISCO CORPORATION, Tokyo (JP)

(72) Inventors: Kentaro Iizuka, Tokyo (JP); Naoki Omiya, Tokyo (JP); Takashi Mori, Tokyo (JP); Satoshi Yamanaka, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 455 days.

(21) Appl. No.: 16/000,462

(22) Filed: Jun. 5, 2018

(65) Prior Publication Data

US 2018/0354067 A1 Dec. 13, 2018

(30) Foreign Application Priority Data

Jun. 8, 2017 (JP) .............................. JP2017-113391

(51) Int. Cl.
| | |
|---|---|
| *B23K 26/53* | (2014.01) |
| *H01L 21/02* | (2006.01) |
| *B23K 26/00* | (2014.01) |
| *H01L 29/16* | (2006.01) |
| *B23K 103/00* | (2006.01) |

(52) U.S. Cl.
CPC .......... *B23K 26/53* (2015.10); *B23K 26/0006* (2013.01); *H01L 21/02002* (2013.01); *H01L 29/1608* (2013.01); *B23K 2103/56* (2018.08)

(58) Field of Classification Search
CPC ........ B23K 26/53; B23K 26/50; B23K 26/38; B23K 26/10; B23K 26/364; B23K 26/362; B23K 2103/50; B23K 2103/56; B23K 2101/40; B28D 5/0011; H01L 21/02002; H01L 21/268; H01L 29/1608; H01L 21/02041; B24B 37/04
See application file for complete search history.

(56) References Cited

U.S. PATENT DOCUMENTS

| | | | | |
|---|---|---|---|---|
| 7,022,000 | B2 * | 4/2006 | Mizomoto | B24B 7/228 451/288 |
| 9,149,886 | B2 * | 10/2015 | Sekiya | B23K 26/0006 |
| 9,190,294 | B2 * | 11/2015 | Yang | B23K 26/364 |

(Continued)

FOREIGN PATENT DOCUMENTS

| | | |
|---|---|---|
| JP | 2000094221 A | 4/2000 |
| JP | 2013049161 A | 3/2013 |

*Primary Examiner* — Orlando E Aviles
*Assistant Examiner* — Robert F Neibaur
(74) *Attorney, Agent, or Firm* — Greer, Burns & Crain, Ltd.

(57) ABSTRACT

A SiC wafer is produced from a single crystal SiC ingot. Wafer producing apparatus includes a holding unit for holding the ingot, a flattening unit for grinding the upper surface of the ingot, thereby flattening the upper surface, a laser applying unit for setting the focal point of a laser beam having a transmission wavelength to the ingot inside the ingot at a predetermined depth from the upper surface of the ingot, the predetermined depth corresponding to the thickness of the wafer to be produced, and next applying the laser beam to the ingot to thereby form a separation layer for separating the wafer from the ingot, a wafer separating unit for holding the upper surface of the ingot to separate the wafer from the ingot along the separation layer, and a wafer storing unit for storing the wafer separated from the ingot.

7 Claims, 18 Drawing Sheets

(56) References Cited

U.S. PATENT DOCUMENTS

| | | | | |
|---|---|---|---|---|
| 9,193,008 B2* | 11/2015 | Morikazu | ............ | B23K 26/402 |
| 9,295,969 B2* | 3/2016 | Okuma | ................ | H01L 23/544 |
| 9,789,623 B2* | 10/2017 | Dillon, Jr. | ............ | B23K 26/702 |
| 2008/0003708 A1* | 1/2008 | Hoshino | ................ | B23K 26/40 |
| | | | | 438/33 |
| 2010/0009549 A1* | 1/2010 | Sekiya | ................ | H01L 21/268 |
| | | | | 438/795 |
| 2013/0248500 A1* | 9/2013 | Shreter | ............. | B23K 26/0622 |
| | | | | 219/121.67 |
| 2014/0073224 A1* | 3/2014 | Yamashita | ............ | H01L 21/302 |
| | | | | 451/29 |
| 2015/0038062 A1* | 2/2015 | Umeda | ................ | B23K 26/53 |
| | | | | 451/70 |
| 2015/0332910 A1* | 11/2015 | Morikazu | ............ | H01L 21/268 |
| | | | | 438/798 |

* cited by examiner

WAFER PRODUCING APPARATUS

BACKGROUND OF THE INVENTION

Field of the Invention

The present invention relates to a wafer producing apparatus for producing an SiC wafer from a single crystal SiC ingot.

Description of the Related Art

Various devices such as integrated circuits (ICs), large scale integrated circuits (LSIs), and light emitting diodes (LEDs) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips corresponding to the respective devices. The device chips thus obtained are used in various electrical equipment such as mobile phones and personal computers.

In general, the wafer on which the devices are to be formed is produced by slicing a cylindrical semiconductor ingot with a wire saw. Both sides of the wafer sliced from the ingot are polished to a mirror finish (see Japanese Patent Laid-open No. 2000-94221, for example). However, when the ingot is cut by the wire saw and both sides of each wafer are polished to obtain the product, a large proportion (70% to 80%) of the ingot is discarded to cause a problem of poor economy. In particular, a single crystal SiC ingot has high hardness and it is therefore difficult to cut this SiC ingot with the wire saw. Accordingly, considerable time is required for cutting of the SiC ingot, causing a reduction in productivity. Furthermore, since this SiC ingot is high in unit price, there is a problem in efficiently producing an SiC wafer in this prior art.

A technique for solving this problem has been proposed (see Japanese Patent Laid-open No. 2013-49161, for example). This technique includes the steps of setting the focal point of a laser beam having a transmission wavelength to single crystal SiC inside a single crystal SiC ingot, next applying the laser beam to the SiC ingot to thereby form a separation layer in a given plane previously set inside the SiC ingot, and next breaking the SiC ingot along the given plane where the separation layer has been formed, thus separating an SiC wafer from the SiC ingot.

SUMMARY OF THE INVENTION

However, the step of forming the separation layer inside the SiC ingot, the step of separating the SiC wafer from the SiC ingot, and the step of grinding the upper surface of the SiC ingot to thereby flatten the upper surface of the SiC ingot are all performed manually, causing a reduction in production efficiency.

It is therefore an object of the present invention to provide a wafer producing apparatus which can automatically produce an SiC wafer from a single crystal SiC ingot.

In accordance with an aspect of the present invention, there is provided a wafer producing apparatus for producing an SiC wafer from a single crystal SiC ingot, the wafer producing apparatus including a holding unit for holding the ingot; a flattening unit for grinding the upper surface of the ingot held by the holding unit, thereby flattening the upper surface of the ingot; a laser applying unit for setting the focal point of a laser beam having a transmission wavelength to the ingot inside the ingot at a predetermined depth from the upper surface of the ingot held by the holding unit, the predetermined depth corresponding to the thickness of the wafer to be produced, and next applying the laser beam to the ingot to thereby form a separation layer for separating the wafer from the ingot; a wafer separating unit for holding the upper surface of the ingot to separate the wafer from the ingot along the separation layer; and a wafer storing unit for storing the wafer separated from the ingot.

Preferably, the wafer producing apparatus further includes an ingot storing unit for storing the ingot and an ingot transfer unit for transferring the ingot from the ingot storing unit to the holding unit. Preferably, the wafer producing apparatus further includes a cleaning unit for cleaning the ingot processed by the flattening unit. Preferably, the holding unit is provided on a turn table, so that when the turn table is rotated, the holding unit is positioned sequentially below the flattening unit, the laser applying unit, and the wafer separating unit.

According to the wafer producing apparatus of the present invention, the wafer can be automatically produced from the ingot and then stored into the wafer storing unit. Accordingly, the production efficiency can be improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
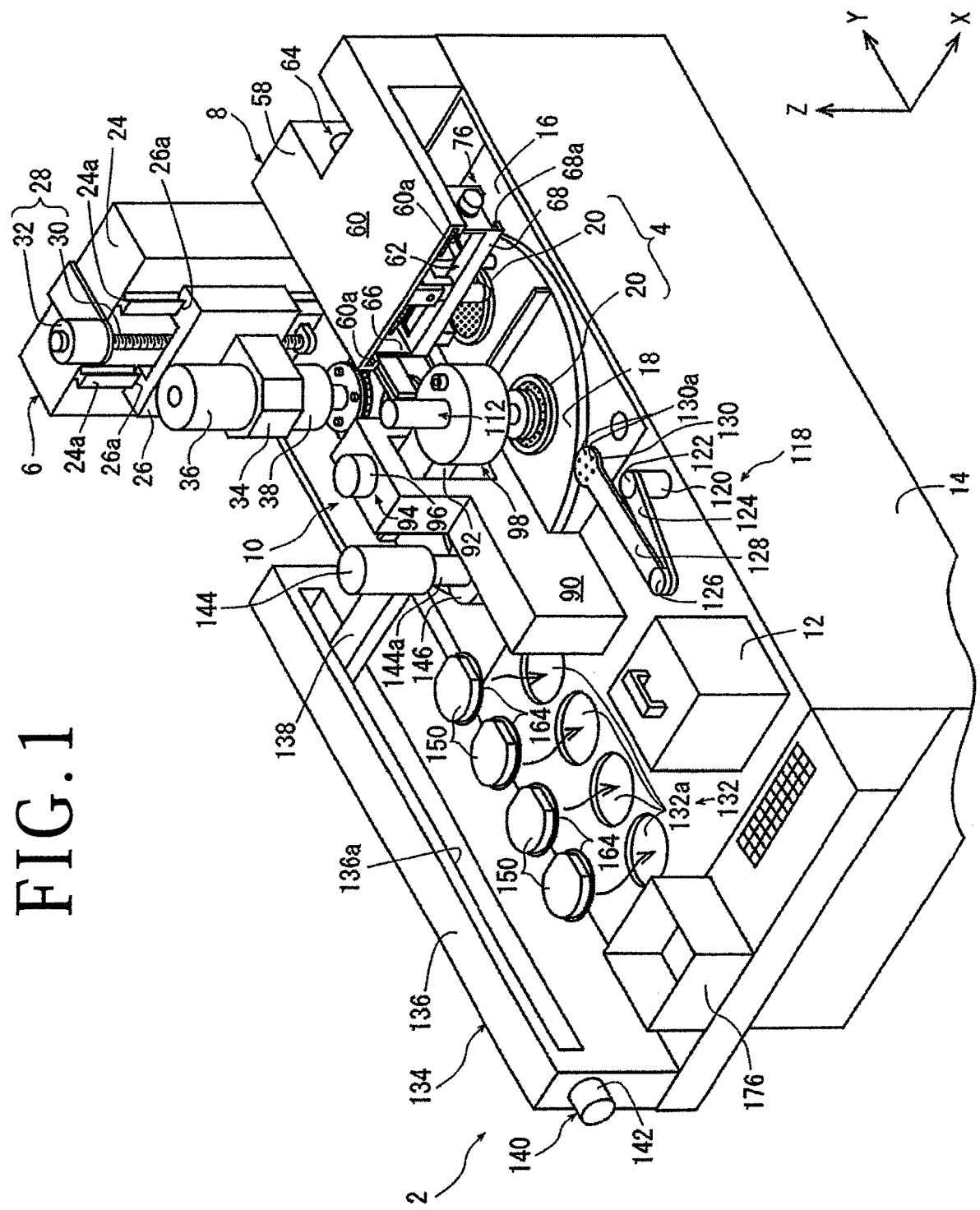
FIG. 1 is a perspective view of a wafer producing apparatus according to a preferred embodiment of the present invention.

A preferred embodiment of the wafer producing apparatus according to the present invention will now be described with reference to the drawings. FIG. 1 shows a wafer producing apparatus 2 according to this preferred embodiment. The wafer producing apparatus 2 includes a holding unit 4 for holding a single crystal SiC ingot (which will be hereinafter referred to simply as "ingot"), a flattening unit 6 for grinding the upper surface of the ingot held by the holding unit 4, thereby flattening the upper surface of the ingot, a laser applying unit 8 for setting the focal point of a laser beam having a transmission wavelength to the ingot inside the ingot at a predetermined depth from the upper surface of the ingot held by the holding unit 4, the predetermined depth corresponding to the thickness of an SiC wafer to be produced (which will be hereinafter referred to simply as "wafer"), and next applying the laser beam to the ingot to thereby form a separation layer for separating the wafer from the ingot, a wafer separating unit 10 for holding the upper surface of the ingot to separate the wafer from the ingot along the separation layer, and a wafer storing unit 12 for storing the wafer separated from the ingot.

Figure 2:
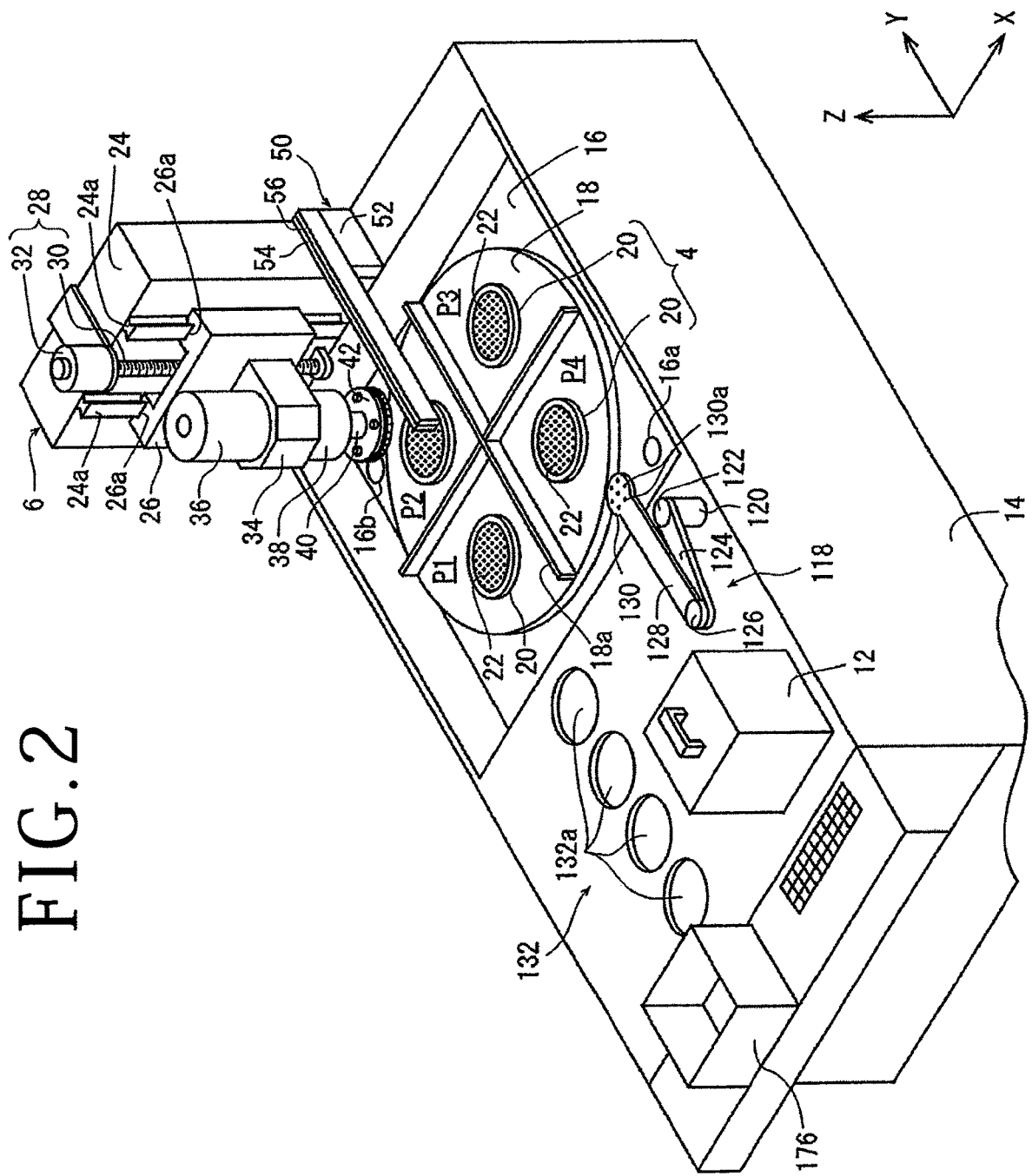
FIG. 2 is a perspective view of an essential part of the wafer producing apparatus shown in FIG. 1.

The holding unit 4 will now be described with reference to FIG. 2. The wafer producing apparatus 2 includes a base 14 having an upper surface. The upper surface of the base 14 is recessed to form a turn table accommodating portion 16 having a rectangular shape as viewed in plan. A circular turn table 18 is accommodated in the turn table accommodating portion 16. The turn table 18 is adapted to be rotated by a turn table motor (not shown) built in the base 14. The turn table 18 is rotatable about its axis extending in the Z direction through the radial center of the turn table 18. The holding unit 4 is composed of four circular chuck tables 20 rotatably provided on the upper surface of the turn table 18. Preferably, each chuck table 20 is adapted to be moved essentially to the flattening unit 6, the laser applying unit 8, and the wafer separating unit 10, by the rotation of the turn table 18. That is, as shown in FIG. 2, each chuck table 20 is adapted to take a standby position P1, a flattening position P2 below the flattening unit 6, a separation layer forming position P3 below the laser applying unit 8, and a wafer separating position P4 below the wafer separating unit 10. The four chuck tables 20 are adapted to be rotated by four chuck table motors (not shown) built in the base 14. Each chuck table 20 is rotatable about its axis extending in the Z direction through the radial center of each chuck table 20.

The four chuck tables 20 are arranged at equal intervals in the circumferential direction of the turn table 18 (i.e., at 90-degree intervals), and partitioned by a crossing partition wall 18a provided on the upper surface of the turn table 18. The upper surface of each chuck table 20 is provided with a circular vacuum chuck 22 formed of a porous material. The vacuum chuck 22 has an upper surface present in a substantially horizontal plane. The vacuum chuck 22 of each chuck table 20 is connected through a suction passage to a suction unit (not shown). Accordingly, a suction force generated by the suction unit is adapted to be applied to the upper surface of the vacuum chuck 22 in each chuck table 20 constituting the holding unit 4, so that the ingot placed on the upper surface of the vacuum chuck 22 can be held under suction. The Z direction is a vertical direction shown by an arrow Z in FIG. 2. Further, the X direction shown by an arrow X in FIG. 2 is a direction perpendicular to the Z direction, and the Y direction shown by an arrow Y in FIG. 2 is a direction perpendicular to both the X direction and the Z direction. The XY plane defined by the X direction and the Y direction is a substantially horizontal plane.

As shown in FIG. 2, the flattening unit 6 includes a rectangular mounting wall 24 extending in the Z direction from the upper surface of the base 14 at one end thereof in the Y direction, a rectangular Z movable plate 26 mounted on the mounting wall 24 so as to be movable in the Z direction, and a Z moving mechanism 28 for moving the Z movable plate 26 in the Z direction. A pair of guide rails 24a extending in the Z direction are provided on one side of the mounting wall 24 (i.e., on the front side in the Y direction in FIG. 2). The guide rails 24a are spaced from each other in the X direction. As corresponding to the guide rails 24a of the mounting wall 24, a pair of guided rails 26a extending in the Z direction are formed on the Z movable plate 26. The guided rails 26a of the Z movable plate 26 are slidably engaged with the guide rails 24a of the mounting wall 24, so that the Z movable plate 26 is mounted on the mounting wall 24 so as to be movable in the Z direction. The Z moving mechanism 28 has a ball screw 30 extending in the Z direction along one side of the mounting wall 24 and a motor 32 connected to one end of the ball screw 30. The ball screw 30 has a nut portion (not shown), which is fixed to the Z movable plate 26. Accordingly, the rotary motion of the motor 32 is converted into a linear motion by the ball screw 30, and this linear motion is transmitted to the Z movable plate 26, so that the Z movable plate 26 can be moved in the Z direction along the guide rails 24a of the mounting wall 24 by operating the Z moving mechanism 28.

Figure 3:
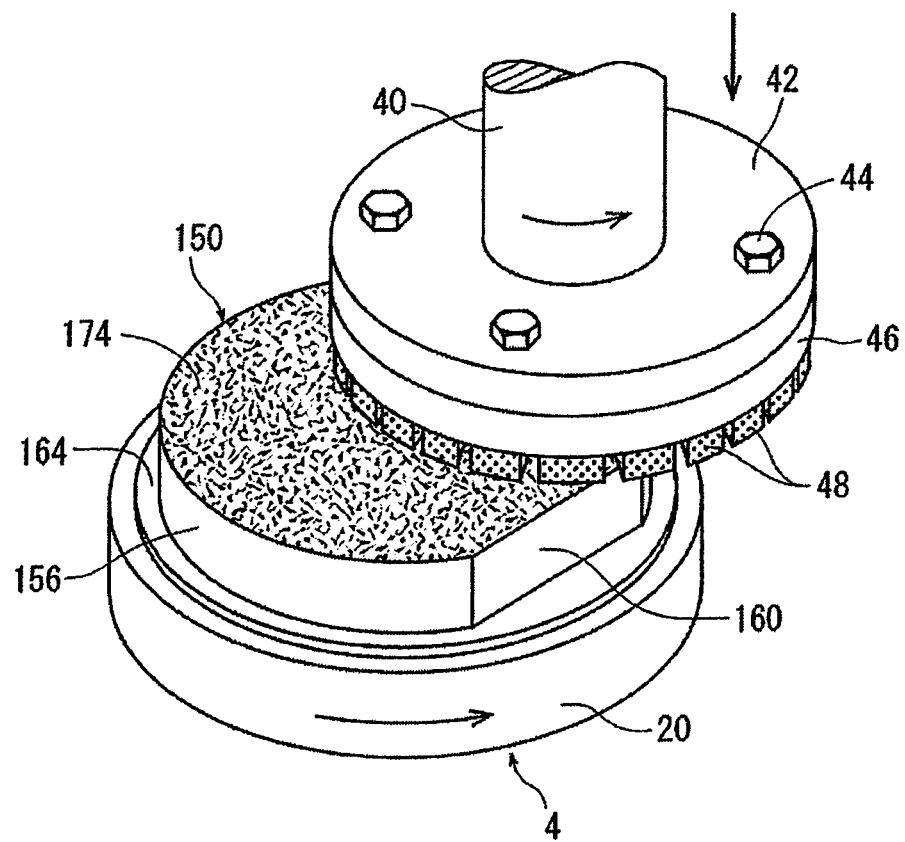
FIG. 3 is an enlarged perspective view of an essential part of a flattening unit shown in FIG. 2.

The flattening unit 6 will further be described with reference to FIGS. 2 and 3. A support block 34 is fixed to the front side of the Z movable plate 26 so as to project in the Y direction. A motor 36 is supported on the upper surface of the support block 34, and a cylindrical spindle housing 38 is supported on the lower surface of the support block 34 so as to extend downward. A cylindrical spindle 40 is supported to the spindle housing 38 so as to be rotatable about a vertical axis extending in the Z direction. The upper end of the spindle 40 is connected to the motor 36, so that the spindle 40 can be rotated about its axis by operating the motor 36. As shown in FIG. 3, a disk-shaped wheel mount 42 is fixed to the lower end of the spindle 40. A grinding wheel 46 is fixed to the lower surface of the wheel mount 42 by bolts 44. A plurality of abrasive members 48 are fixed to the lower surface of the grinding wheel 46 so as to be annularly arranged at given intervals along the outer circumference of the grinding wheel 46. As shown in FIG. 3, when the chuck table 20 is set at the flattening position P2, the center of rotation of the grinding wheel 46 is deviated from the center of rotation of the chuck table 20 in such a manner that a ring formed by the plural abrasive members 48 passes through the center of the chuck table 20 as viewed in plan. Accordingly, when both the chuck table 20 and the grinding wheel 46 are rotated and the abrasive members 48 come into contact with the upper surface of the ingot held on the chuck table 20, the whole of the upper surface of the ingot can be ground by the abrasive members 48 in the flattening unit 6. Thus, the upper surface of the ingot held on the chuck table 20 can be uniformly ground to be flattened.

Figure 4:
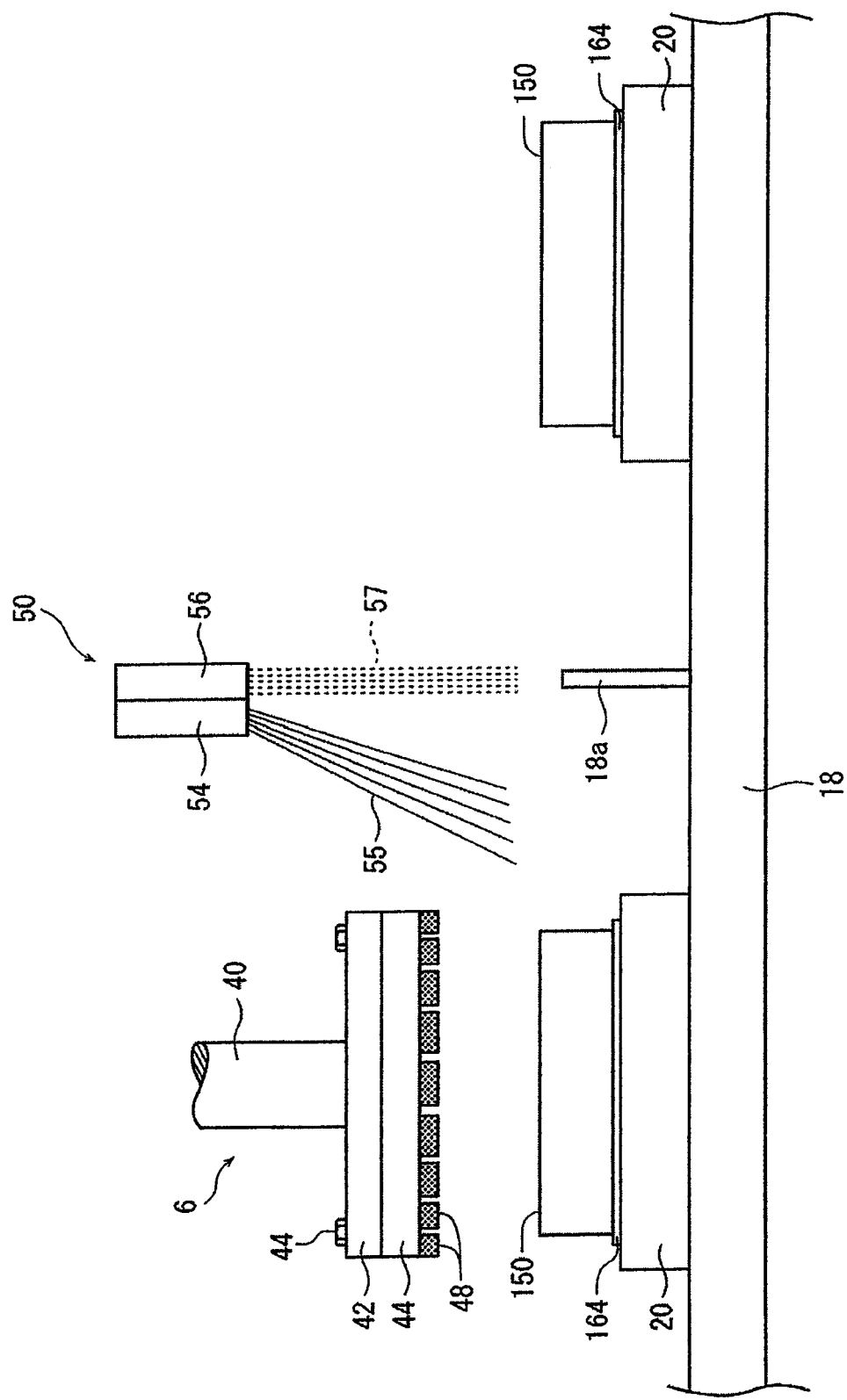
FIG. 4 is a schematic view showing the operation of a cleaning unit shown in FIG. 2, in which a cleaning water is discharged from a first cleaning portion and a compressed air is discharged from a second cleaning portion.

Preferably, the wafer producing apparatus 2 includes a cleaning unit 50 for cleaning the ingot whose upper surface has been flattened by the flattening unit 6. As shown in FIG. 2, the cleaning unit 50 includes a support member 52 mounted on the upper surface of the base 14 along the side surface of the mounting wall 24 of the flattening unit 6, a first cleaning portion 54 extending from the upper end of the support member 52 in the Y direction, and a second cleaning portion 56 extending from the upper end of the support member 52 in the Y direction so as to be juxtaposed to the first cleaning portion 54 in the X direction. The first cleaning portion 54 may be formed from a hollow member, and a plurality of nozzle holes (not shown) are formed on the lower surface of the first cleaning portion 54 so as to be spaced in the Y direction. The plural nozzle holes of the first cleaning portion 54 are connected through a fluid passage to a cleaning water supply unit (not shown). Similarly, the second cleaning portion 56 may be formed of a hollow member, and a plurality of nozzle holes (not shown) are formed on the lower surface of the second cleaning portion 56 so as to be spaced in the Y direction. The plural nozzle holes of the second cleaning portion 56 are connected through a fluid passage to a compressed air source (not shown). As shown in FIG. 4, the cleaning unit 50 is operated in such a manner that a cleaning water 55 is discharged obliquely downward from each nozzle hole of the first cleaning portion 54 toward the ingot held on the chuck table 20 set below the flattening unit 6, thereby removing a grinding dust from the ingot. Further, a compressed air 57 is discharged downward from each nozzle hole of the second cleaning portion 56, thereby removing the cleaning water 55 from the ingot. Thus, the ingot flattened by the flattening unit 6 can be cleaned by the cleaning unit 50.

Figure 5:
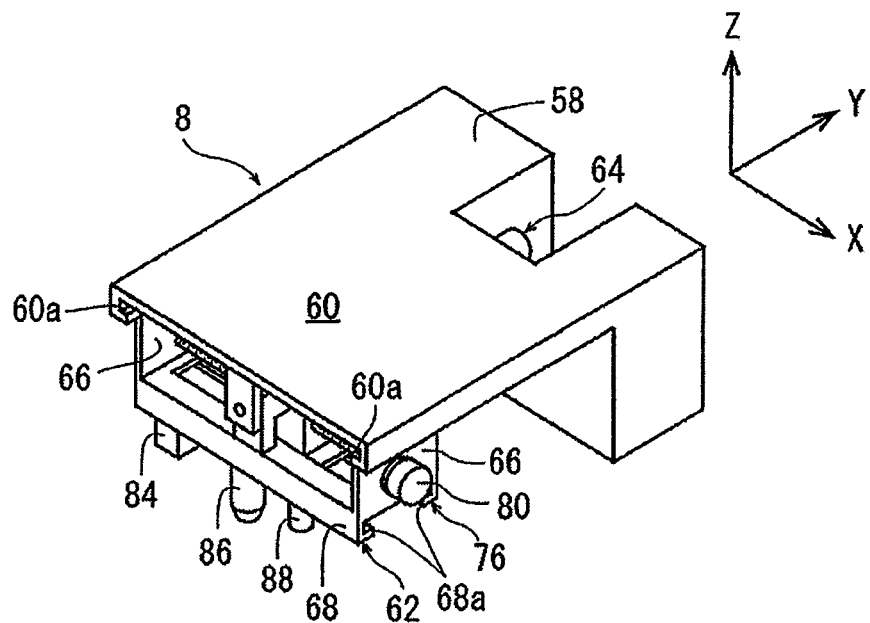
FIG. 5 is a perspective view of a laser applying unit shown in FIG. 1.
Figure 6:
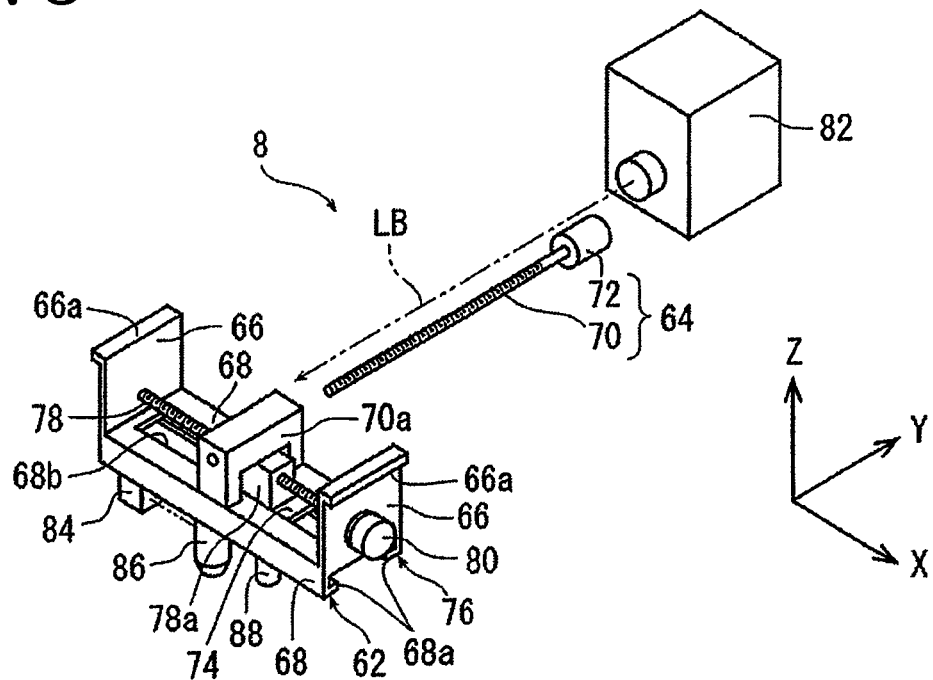
FIG. 6 is a view similar to FIG. 5, showing a condition where a frame member is removed from the laser applying unit.

The laser applying unit 8 will now be described with reference to FIGS. 1, 5, and 6. The laser applying unit 8 includes a frame member 58 extending upward from the upper surface of the base 14 so as to be located adjacent to the mounting wall 24 of the flattening unit 6 in the X direction, a rectangular guide plate 60 extending from the upper end of the frame member 58 in the Y direction, a Y movable member 62 supported to the guide plate 60 so as to be movable in the Y direction, and a Y moving mechanism 64 for moving the Y movable member 62 in the Y direction. A pair of guide rails 60a extending in the Y direction are formed on the lower surface of the guide plate 60 at its opposite ends in the X direction. As shown in FIG. 6, the Y movable member 62 has a pair of guided portions 66 spaced in the X direction and a mounting portion 68 extending in the X direction so as to connect the lower ends of the guided portions 66. A guided rail 66a extending in the Y direction is formed at the upper end of each guided portion 66. The guided rails 66a of the guided portion 66 are slidably engaged with the guide rails 60a of the guide plate 60, so that the Y movable member 62 is supported to the guide plate 60 so as to be movable in the Y direction. Further, a pair of guide rails 68a extending in the X direction are formed on the lower surface of the mounting portion 68 at its opposite ends in the Y direction. As shown in FIG. 6, the Y moving mechanism 64 has a ball screw 70 extending in the Y direction so as to be located below the guide plate 60 and a motor 72 connected to one end of the ball screw 70. The ball screw 70 has an inverted U-shaped nut portion 70a, which is fixed to the upper surface of the mounting portion 68. Accordingly, the rotary motion of the motor 72 can be converted into a linear motion by the ball screw 70, and this linear motion can be transmitted to the Y movable member 62. As a result, the Y movable member 62 can be moved in the Y direction along the guide rails 60a of the guide plate 60 by operating the Y moving mechanism 64.

The laser applying unit 8 will further be described with reference to FIG. 6. The laser applying unit 8 further includes an X movable plate 74 mounted on the mounting portion 68 of the Y movable member 62 so as to be movable in the X direction and an X moving mechanism 76 for moving the X movable plate 74 in the X direction. The opposite ends of the X movable plate 74 in the Y direction are slidably engaged with the guide rails 68a of the mounting portion 68, so that the X movable plate 74 is mounted on the mounting portion 68 so as to be movable in the X direction. The X moving mechanism 76 has a ball screw 78 extending in the X direction so as to be located above the mounting portion 68 and a motor 80 connected to one end of the ball screw 78. The ball screw 78 has a nut portion 78a, which is fixed to the upper surface of the X movable plate 74. The mounting portion 68 has an elongated opening 68b in which the nut portion 78a is movable in the X direction. Accordingly, the rotary motion of the motor 80 can be converted into a linear motion by the ball screw 78, and this linear motion can be transmitted to the X movable plate 74. As a result, the X movable plate 74 can be moved in the X direction along the guide rails 68a of the mounting portion 68 by operating the X moving mechanism 76.

Figure 7:
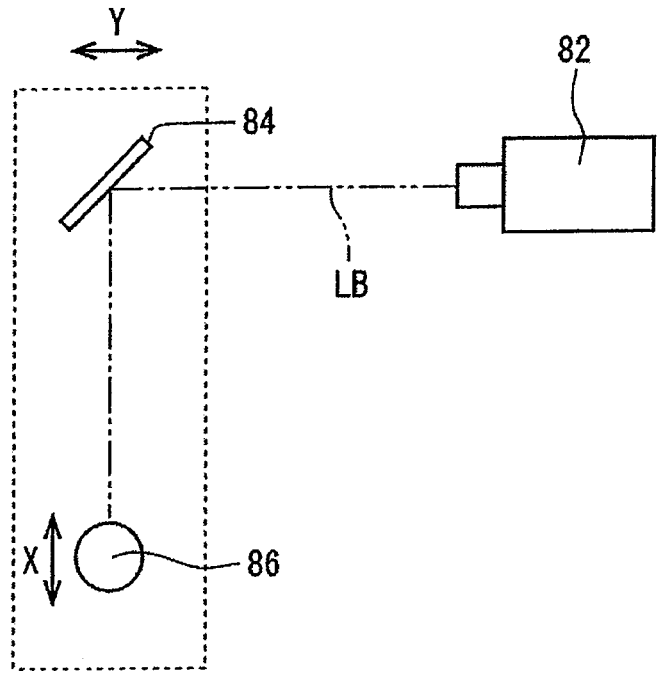
FIG. 7 is a block diagram of the laser applying unit shown in FIG. 5.

The laser applying unit 8 will further be described with reference to FIGS. 6 and 7. The laser applying unit 8 further includes a laser oscillator 82 built in the frame member 58, a first mirror 84 mounted on the lower surface of the mounting portion 68 of the Y movable member 62 so as to be spaced from the laser oscillator 82 in the Y direction, a second mirror (not shown) mounted on the lower surface of the X movable plate 74 so as to be spaced from the first mirror 84 in the X direction, focusing means 86 mounted on the lower surface of the X movable plate 74 so as to be movable in the Z direction, an alignment unit 88 mounted on the lower surface of the X movable plate 74 so as to be spaced from the focusing means 86 in the X direction, and a focal position adjusting unit (not shown) for moving the focusing means 86 in the Z direction to adjust the Z position of the focal point of the focusing means 86. The second mirror is located directly above the focusing means 86. The laser oscillator 82 functions to oscillate a pulsed laser beam LB having a transmission wavelength to the ingot. The focusing means 86 has a focusing lens (not shown) for focusing the pulsed laser beam LB oscillated from the laser oscillator 82. The focusing lens is located below the second mirror. The alignment unit 88 functions to image the ingot held on the chuck table 20 and detect an area to be laser-processed. The focal position adjusting unit may be so configured as to have a ball screw (not shown) extending in the Z direction and a motor (not shown) connected to one end of the ball screw, in which the ball screw has a nut portion fixed to the focusing means 86.

The focal position adjusting unit is operated in such a manner that the rotary motion of the motor is converted into a linear motion by the ball screw, and this linear motion is transmitted to the focusing means 86. Accordingly, the focusing means 86 can be moved in the Z direction along a guide rail (not shown), so that the Z position of the focal point of the pulsed laser beam LB to be focused by the focusing lens can be adjusted. The optical path of the pulsed laser beam LB to be oscillated from the laser oscillator 82 is set to extend in the Y direction. The first mirror 84 functions to change the optical path of the pulsed laser beam LB oscillated from the laser oscillator 82 from the Y direction to the X direction. The second mirror functions to change the optical path of the pulsed laser beam LB reflected by the first mirror 84 from the X direction to the Z direction, thereby introducing the pulsed laser beam LB to the focusing lens of the focusing means 86. The pulsed laser beam LB thus introduced to the focusing lens is focused by the focusing lens and applied to the ingot held on the chuck table 20. Even when the focusing means 86 is moved in the Y direction by operating the Y moving mechanism 64 to move the Y movable member 62 or the focusing means 86 is moved in the X direction by operating the X moving mechanism 76 to move the X movable plate 74, the optical path of the pulsed laser beam LB oscillated from the laser oscillator 82 is changed from the Y direction to the X direction by the first mirror 84 and introduced to the second mirror. Thereafter, the optical path of the pulsed laser beam LB introduced to the second mirror is changed from the X direction to the Z direction by the second mirror and introduced to the focusing means 86.

In the laser applying unit 8 configured above, a separation layer can be formed inside the ingot by applying the pulsed laser beam LB to the ingot in the following manner. First, the ingot held on the chuck table 20 is imaged by the alignment unit 88 to detect an area to be laser-processed. Thereafter, the focusing means 86 is moved in the Z direction by operating the focal position adjusting unit to set the focal point of the pulsed laser beam LB having a transmission wavelength to the ingot inside the ingot at a predetermined depth from the upper surface of the ingot held on the chuck table 20, the predetermined depth corresponding to the thickness of the wafer to be produced. Thereafter, the pulsed laser beam LB is applied from the focusing means 86 to the ingot held on the chuck table 20 as suitably moving the X movable plate 74 in the X direction by operating the X moving mechanism 76 and also suitably moving the Y movable member 62 in the Y direction by operating the Y moving mechanism 64.

Figure 8:
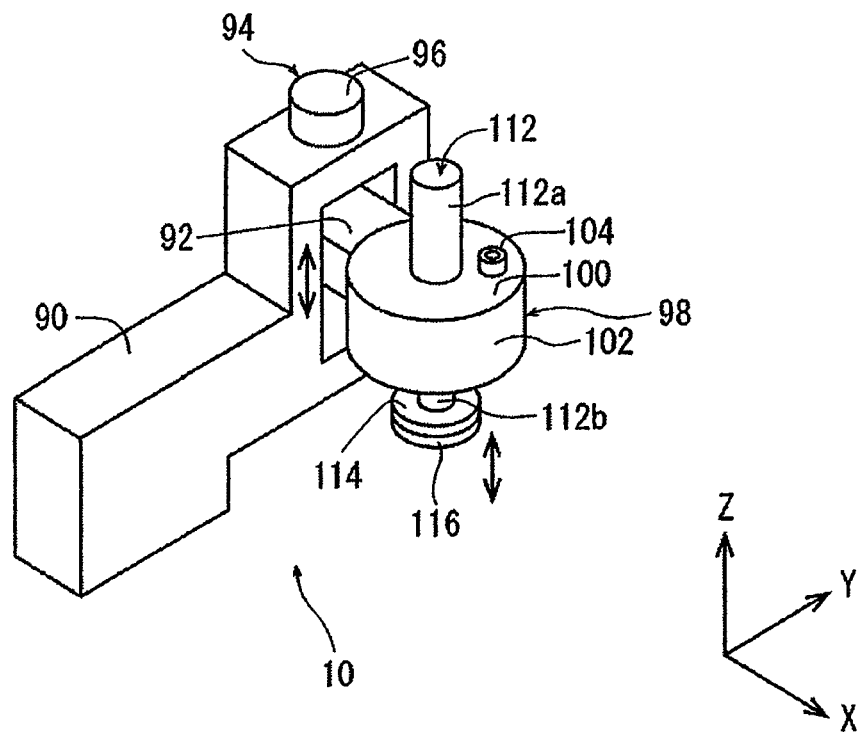
FIG. 8 is a perspective view of a wafer separating unit shown in FIG. 1.

The wafer separating unit 10 will now be described with reference to FIGS. 1 and 8. The wafer separating unit 10 functions to apply ultrasonic vibration to the ingot in which the separation layer has been formed by the laser applying unit 8, thereby separating the wafer from the ingot along the separation layer. The wafer separating unit 10 includes a support member 90 fixed to the upper surface of the base 14, an arm 92 having a base end supported to the support member 90 so as to be movable in the Z direction, the arm 92 extending from the base end in the X direction, and an arm moving mechanism 94 for moving the arm 92 in the Z direction. The arm moving mechanism 94 has a ball screw (not shown) extending in the Z direction so as to be located in the support member 90 and a motor 96 connected to one end of this ball screw. The ball screw of the arm moving mechanism 94 has a nut portion (not shown), which is fixed to the base end of the arm 92. Accordingly, the rotary motion of the motor 96 can be converted into a linear motion by the ball screw, and this linear motion can be transmitted to the arm 92. As a result, the arm 92 can be moved in the Z direction by the arm moving mechanism 94 along a guide rail (not shown) built in the support member 90 so as to extend in the Z direction.

Figure 9:
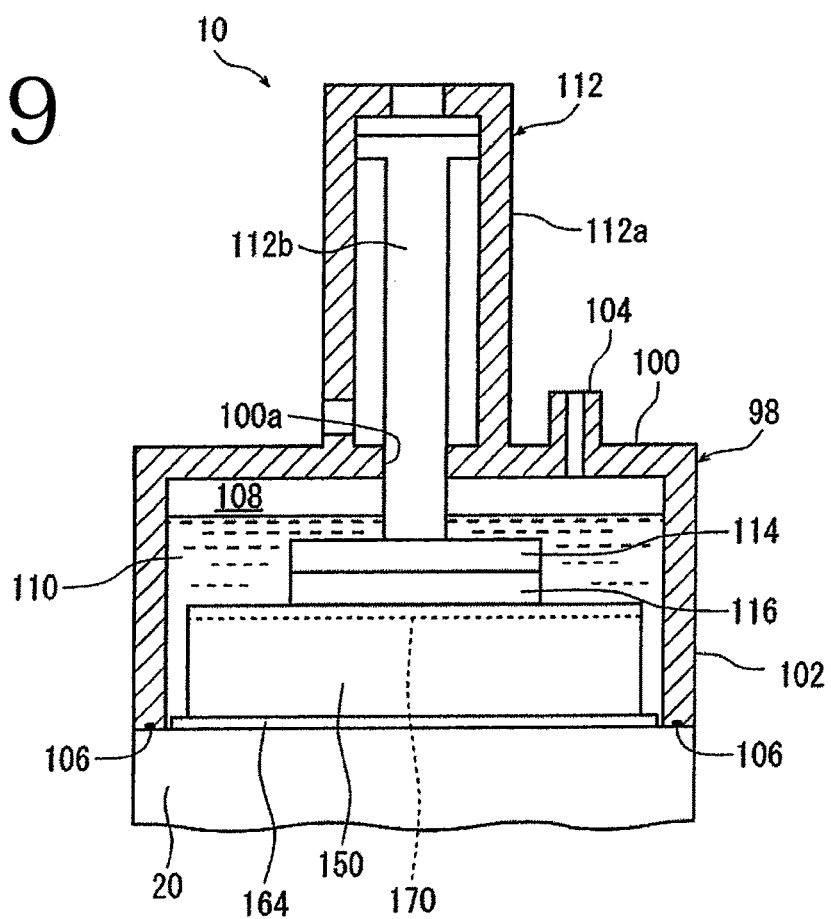
FIG. 9 is a sectional view of the wafer separating unit shown in FIG. 1.

The wafer separating unit 10 will further be described with reference to FIGS. 8 and 9. A liquid tank 98 is fixed to the front end of the arm 92. The liquid tank 98 functions to store a liquid in cooperation with the chuck table 20 in separating the wafer from the ingot. The liquid tank 98 has a circular top wall 100 and a cylindrical side wall 102 extending downward from the outer circumference of the top wall 100. That is, the bottom of the liquid tank 98 is open. The top wall 100 is formed with a cylindrical liquid inlet portion 104 communicating with the inside of the liquid tank 98 and the outside thereof. The liquid inlet portion 104 is connected through a fluid passage to a liquid supply unit (not shown). As shown in FIG. 9, an annular gasket 106 is mounted on the lower end of the side wall 102. When the arm 92 is lowered by the arm moving mechanism 94 to make the lower end of the side wall 102 into close contact with the upper surface of the chuck table 20, a liquid storing space 108 is defined by the upper surface of the chuck table 20 and the inside surface of the liquid tank 98. A liquid 110 is supplied from the liquid supply unit through the liquid inlet portion 104 into the liquid storing space 108. At this time, the leakage of the liquid 110 stored in the liquid storing space 108 is prevented by the gasket 106.

The wafer separating unit 10 will further be described with reference to FIGS. 8 and 9. An air cylinder 112 is mounted on the top wall 100 of the liquid tank 98. The air cylinder 112 includes a cylinder tube 112a and a piston rod 112b. The cylinder tube 112a extends upward from the upper surface of the top wall 100. The piston rod 112b is accommodated in the cylinder tube 112a, and the lower end portion of the piston rod 112b is inserted through an opening 100a of the top wall 100 to project downward from the top wall 100. A disk-shaped ultrasonic vibration generating member 114 is fixed to the lower end of the piston rod 112b. The ultrasonic vibration generating member 114 may be formed of piezoelectric ceramic. A disk-shaped suction member 116 is fixed to the lower surface of the ultrasonic vibration generating member 114. The lower surface of the suction member 116 is formed with a plurality of suction holes (not shown), which are connected through a suction passage to a suction unit (not shown). Accordingly, a suction force generated by the suction unit can be applied to the lower surface of the suction member 116, thereby holding the ingot on the lower surface of the suction member 116 under suction. The wafer separating unit 10 configured above is operated in the following manner. The arm 92 is lowered by the arm moving mechanism 94 until the lower end of the side wall 102 comes into close contact with the upper surface of the chuck table 20 holding the ingot in which the separation layer has been formed by the laser applying unit 8. Further, the piston rod 112b of the air cylinder 112 is lowered until the lower surface of the suction member 116 comes into contact with the upper surface of the ingot held on the chuck table 20 to hold the upper surface of the ingot under suction. Thereafter, the liquid 110 is stored into the liquid storing space 108, and the ultrasonic vibration generating member 114 is next operated to apply ultrasonic vibration to the ingot. As a result, the wafer can be separated from the ingot along the separation layer as a separation start point.

The wafer storing unit 12 will now be described with reference to FIGS. 1 and 2. The wafer storing unit 12 is configured by a cassette capable of storing a plurality of wafers in the condition where these wafers are arranged at given intervals in a vertical direction, in which each wafer has been separated from the ingot along the separation layer by the wafer separating unit 10. The cassette is detachably mounted on the upper surface of the base 14. Further, a wafer transfer unit 118 is provided between the wafer separating unit 10 and the wafer storing unit 12. The wafer transfer unit 118 functions to transfer the wafer from the wafer separating unit 10 to the wafer storing unit 12 after the wafer has been separated from the ingot along the separation layer by the wafer separating unit 10. As shown in FIG. 2, the wafer transfer unit 118 includes an elevating unit 120 extending upward from the upper surface of the base 14, a first motor 122 fixed to the upper end of the elevating unit 120, a first arm 124 connected at its base end to the first motor 122 so as to be rotatable about an axis extending in the Z direction, a second motor 126 fixed to the front end of the first arm 124, a second arm 128 connected at its base end to the second motor 126 so as to be rotatable about an axis extending in the Z direction, and a disk-shaped suction member 130 fixed to the front end of the second arm 128.

The first motor 122 is vertically moved in the Z direction by the elevating unit 120. The first arm 124 is rotated by the first motor 122 with respect to the elevating unit 120 about the rotation axis extending through the base end of the first arm 124 in the Z direction. The second arm 128 is rotated by the second motor 126 with respect to the first arm 124 about the rotation axis extending through the base end of the second arm 128 in the Z direction. The upper surface of the suction member 130 is formed with a plurality of suction holes 130a, which are connected through a suction passage to a suction unit (not shown). Accordingly, a suction force generated by the suction unit can be applied to the upper surface of the suction member 130 in the wafer transfer unit 118, so that the wafer separated from the ingot along the separation layer by the wafer separating unit 10 can be held on the upper surface of the suction member 130 under suction. At the same time, the first arm 124 and the second arm 128 are operated by the elevating unit 120, the first motor 122, and the second motor 126, so that the wafer held by the suction member 130 can be transferred from the wafer separating unit 10 to the wafer storing unit 12.

As shown in FIG. 1, the wafer producing apparatus 2 preferably further includes an ingot storing unit 132 for storing the ingot and an ingot transfer unit 134 for transferring the ingot from the ingot storing unit 132 to the holding unit 4. In this preferred embodiment, the ingot storing unit 132 is composed of four circular storing recesses 132a formed on the upper surface of the base 14 so as to be spaced in the Y direction. Each storing recess 132a has a diameter slightly larger than the diameter of the ingot. Accordingly, the ingot can be stored in each storing recess 132a.

Figure 10:
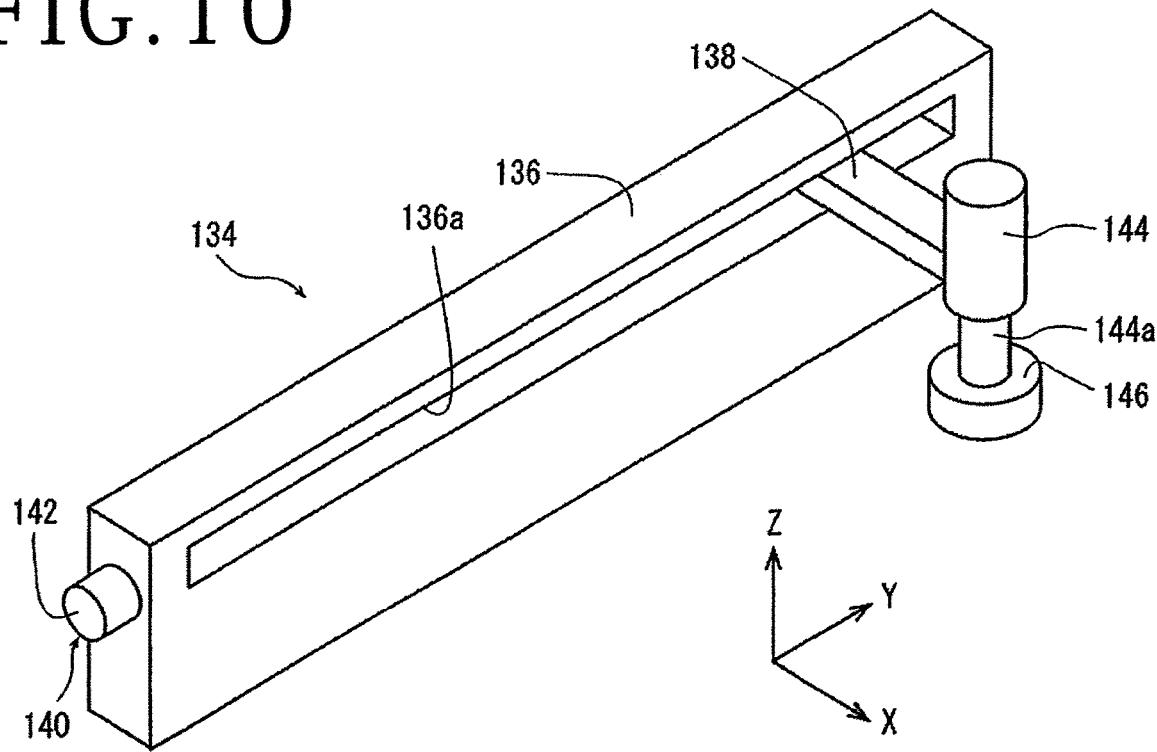
FIG. 10 is a perspective view of an ingot transfer unit shown in FIG. 1.

The ingot transfer unit 134 will now be described with reference to FIGS. 1 and 10. The ingot transfer unit 134 includes a frame member 136 provided on the upper surface of the base 14 so as to extend in the Y direction along the ingot storing unit 132, an arm 138 supported at its base end to the frame member 136 so as to be movable in the Y direction, the arm 138 extending from the base end in the X direction, and an arm moving mechanism 140 for moving the arm 138 in the Y direction. The frame member 136 is formed with a rectangular guide opening 136a elongated in the Y direction. The arm moving mechanism 140 has a ball screw (not shown) extending in the Y direction so as to be located in the frame member 136 and a motor 142 connected to one end of this ball screw. The ball screw of the arm moving mechanism 140 has a nut portion (not shown), which is fixed to the base end of the arm 138. Accordingly, the rotary motion of the motor 142 can be converted into a linear motion by the ball screw, and this linear motion can be transmitted to the arm 138. As a result, the arm 138 can be moved in the Y direction by the arm moving mechanism 140 along the guide opening 136a of the frame member 136. As shown in FIG. 10, an air cylinder 144 extending in the Z direction is mounted on the front end of the arm 138. The air cylinder 144 has a piston rod 144a projecting downward. A disk-shaped suction member 146 is fixed to the lower end of the piston rod 144a. The lower surface of the suction member 146 is formed with a plurality of suction holes (not shown), which are connected through a suction passage to a suction unit (not shown). Accordingly, a suction force generated by the suction unit can be applied to the lower surface of the suction member 146, so that the upper surface of the ingot stored in the ingot storing unit 132 can be held on the lower surface of the suction member 146 under suction. In this condition, by operating the arm moving mechanism 140 to move the arm 138 in the Y direction and operating the air cylinder 144 to move the suction member 146 in the Z direction, the ingot held by the suction member 146 can be transferred from the ingot storing unit 132 to the holding unit 4.

Figure 11A:
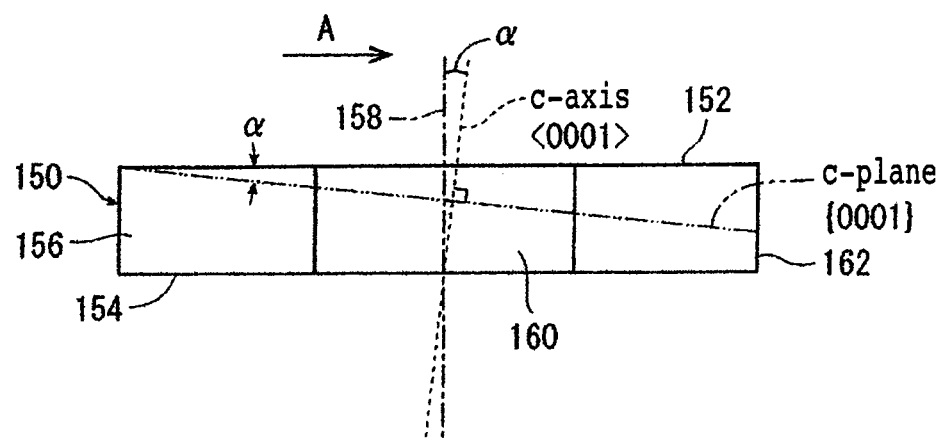
FIG. 11A is an elevational view of a single crystal SiC ingot.
Figure 11B:
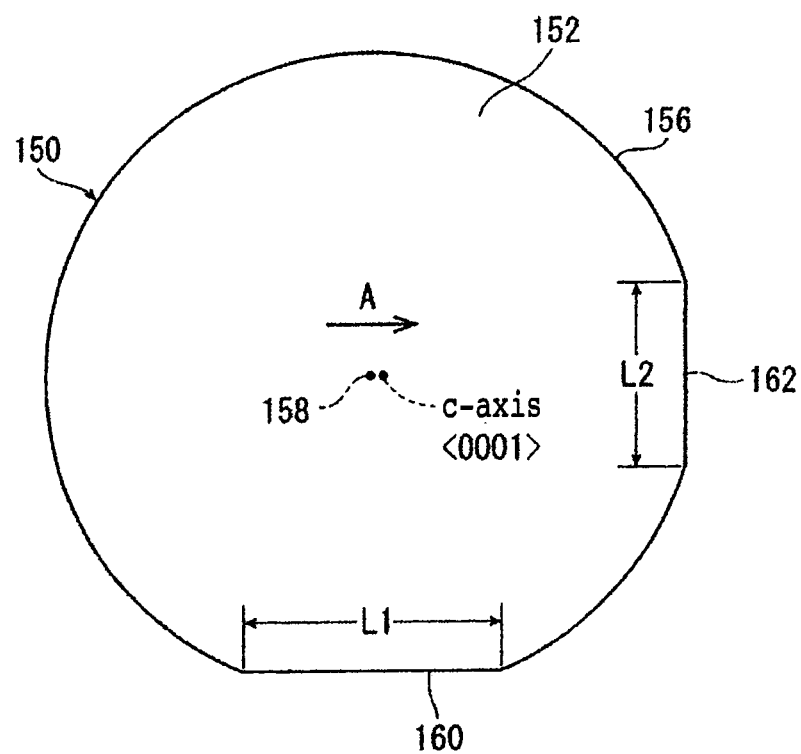
FIG. 11B is a plan view of the ingot shown in FIG. 11A.

FIGS. 11A and 11B show a single crystal SiC ingot 150 to be processed by the wafer producing apparatus 2. The single crystal SiC ingot 150 (which will be hereinafter referred to simply as "ingot 150") is a substantially cylindrical ingot formed of hexagonal single crystal SiC. The ingot 150 has a substantially circular first surface 152, a substantially circular second surface 154 opposite to the first surface 152, a substantially cylindrical surface 156 formed so as to connect the first surface 152 and the second surface 154, a c-axis (<0001> direction) extending from the first surface 152 to the second surface 154, and a c-plane ({0001} plane) perpendicular to the c-axis. In the ingot 150, the c-axis is inclined by an off angle α (e.g., α=1, 3, or 6 degrees) with respect to a normal 158 to the first surface 152. The off angle α is formed between the c-plane and the first surface 152. The direction of formation of the off angle α (i.e., the direction of inclination of the c-axis) is shown by an arrow A in FIGS. 11A and 11B. Further, the cylindrical surface 156 of the ingot 150 is formed with a first orientation flat 160 and a second orientation flat 162, which are both rectangular in shape as viewed in side elevation. These orientation flats 160 and 162 are formed to indicate crystal orientation. The first orientation flat 160 extends parallel to the direction A of formation of the off angle α, and the second orientation flat 162 extends perpendicular to the direction A of formation of the off angle α. As shown in FIG. 11B, which is a plan view taken in the direction of extension of the normal 158, the length L2 of the second orientation flat 162 is set shorter than the length L1 of the first orientation flat 160 (L2<L1). The ingot to be processed by the wafer producing apparatus 2 is not limited to the ingot 150. For example, the ingot to be processed in the present invention may be a single crystal SiC ingot such that the c-axis is not inclined with respect to the normal 158 to the first surface 152, and the off angle α between the c-plane and the first surface 152 is 0 degree (i.e., the c-axis coincides with the normal 158 to the first surface 152). Further, the ingot to be processed in the present invention may be a single crystal GaN ingot formed of single crystal GaN (gallium nitride), for example.

Figure 12A:
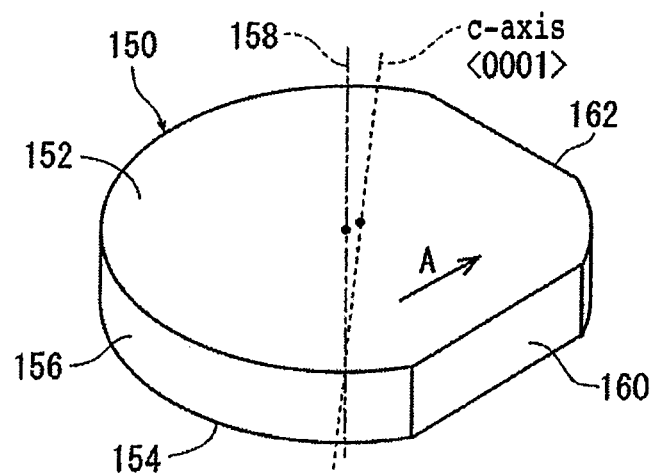
FIG. 12A is a perspective view of the ingot and a substrate to be mounted thereon.
Figure 12A:
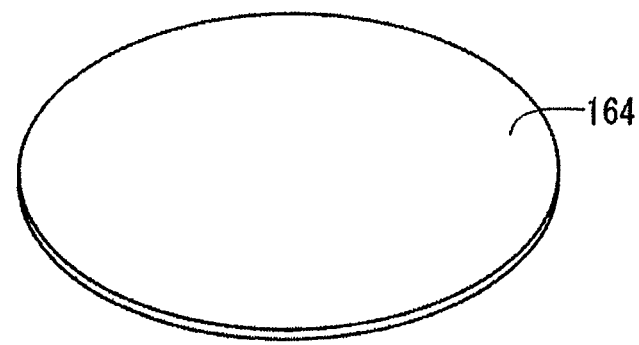
Figure 12B:
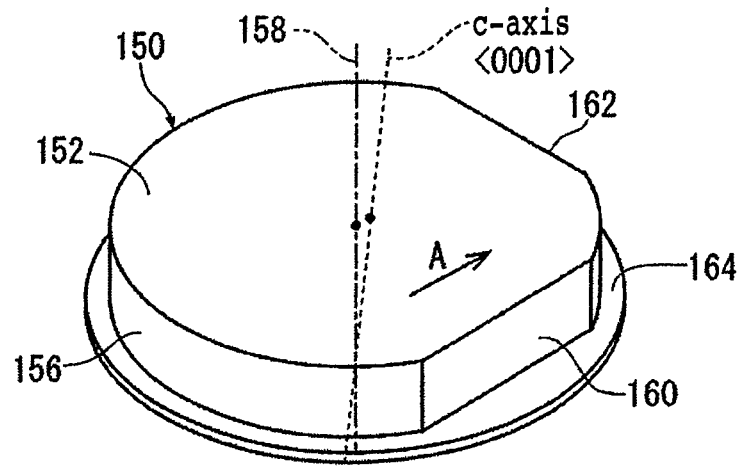
FIG. 12B is a view similar to FIG. 12A, showing a condition where the substrate is mounted on the ingot.

There will now be described a wafer producing method for producing the wafer from the ingot 150 by using the wafer producing apparatus 2. In the wafer producing method using the wafer producing apparatus 2, four ingots 150 are first prepared. Thereafter, as shown in FIGS. 12A and 12B, a substrate mounting step is performed to mount a disk-shaped substrate 164 on an end surface of each ingot 150 (i.e., the second surface 154 of each ingot 150) through a suitable adhesive. The substrate mounting step is performed for the purpose of holding each ingot 150 having the first orientation flat 160 and the second orientation flat 162 on the circular vacuum chuck 22 of the chuck table 20 by applying a predetermined suction force. The diameter of the substrate 164 is slightly larger than the diameter of each ingot 150 and slightly larger than the diameter of the vacuum chuck 22 of the chuck table 20. Accordingly, when each ingot 150 is placed on the chuck table 20 in the condition where the substrate 164 is oriented downward, the vacuum chuck 22 is fully covered with the substrate 164, so that when the suction unit connected to the vacuum chuck 22 is operated, the substrate 164 can be held on the vacuum chuck 22 under suction by a predetermined suction force. Accordingly, each ingot 150 having the first orientation flat 160 and the second orientation flat 162 can be held through the substrate 164 on the chuck table 20 under suction. In the case that the diameter of each ingot is larger than that of the vacuum chuck 22, the upper surface of the vacuum chuck 22 is fully covered with each ingot placed on the chuck table 20. In this case, there is no possibility that air may be sucked around the vacuum chuck 22 in operating the suction unit, so that each ingot can be held on the vacuum chuck 22 under suction by a predetermined suction force. Accordingly, in this case, the substrate mounting step may not be performed.

After performing the substrate mounting step, an ingot storing step is performed to store each ingot 150 into the ingot storing unit 132. In this preferred embodiment shown in FIG. 1, the four ingots 150 each having the substrate 164 are stored into the respective four storing recesses 132a of the ingot storing unit 132, in the condition where the substrate 164 is oriented downward.

Figure 13:
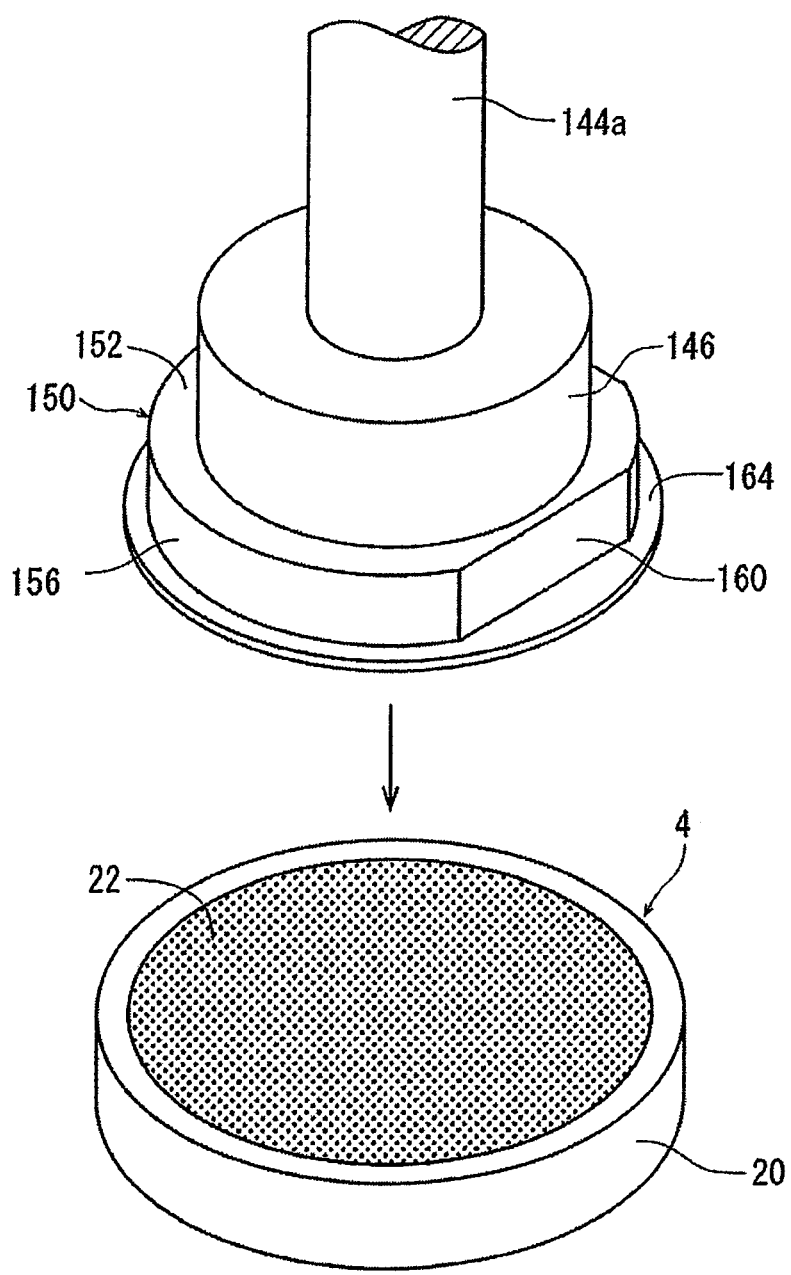
FIG. 13 is a perspective view showing a holding step.

After performing the ingot storing step, an ingot transfer step is performed to transfer each ingot 150 from the ingot storing unit 132 to the holding unit 4 by using the ingot transfer unit 134. In the ingot transfer step, the arm moving mechanism 140 of the ingot transfer unit 134 is first operated to move the arm 138 in the Y direction and then positions the suction member 146 directly above any arbitrary one of the four ingots 150 stored in the ingot storing unit 132 (this arbitrary ingot 150 will be hereinafter referred to "first ingot 150a"). Thereafter, the air cylinder 144 of the ingot transfer unit 134 is operated to lower the suction member 146 and bring the lower surface of the suction member 146 into close contact with the upper surface of the first ingot 150a (e.g., the first surface 152 of the first ingot 150a). Thereafter, the suction unit connected to the suction member 146 is operated to apply a suction force to the lower surface of the suction member 146, thereby holding the upper surface of the first ingot 150a on the lower surface of the suction member 146 under suction. Thereafter, the air cylinder 144 is operated to raise the suction member 146 holding the first ingot 150a. Thereafter, the arm moving mechanism 140 is operated to move the arm 138 in the Y direction and then positions the suction member 146 holding the first ingot 150a directly above the chuck table 20 set at the standby position P1. Thereafter, as shown in FIG. 13, the air cylinder 144 is operated to lower the suction member 146 holding the first ingot 150a until the lower surface of the substrate 164 comes into contact with the upper surface of the chuck table 20 set at the standby position P1. Thereafter, the operation of the suction unit connected to the suction member 146 is stopped to thereby remove the suction force applied to the suction member 146, so that the first ingot 150a is placed on the upper surface of the chuck table 20 set at the standby position P1. In this manner, the first ingot 150a can be transferred from the ingot storing unit 132 to the chuck table 20 of the holding unit 4 by using the ingot transfer unit 134.

After performing the ingot transfer step, a holding step is performed to hold each ingot 150 by using the holding unit 4. More specifically, in the holding step, the suction unit connected to the vacuum chuck 22 on which the first ingot 150a has been placed is operated to apply a suction force to the upper surface of the vacuum chuck 22, thereby holding the first ingot 150a on the chuck table 20 under suction.

Figure 14:
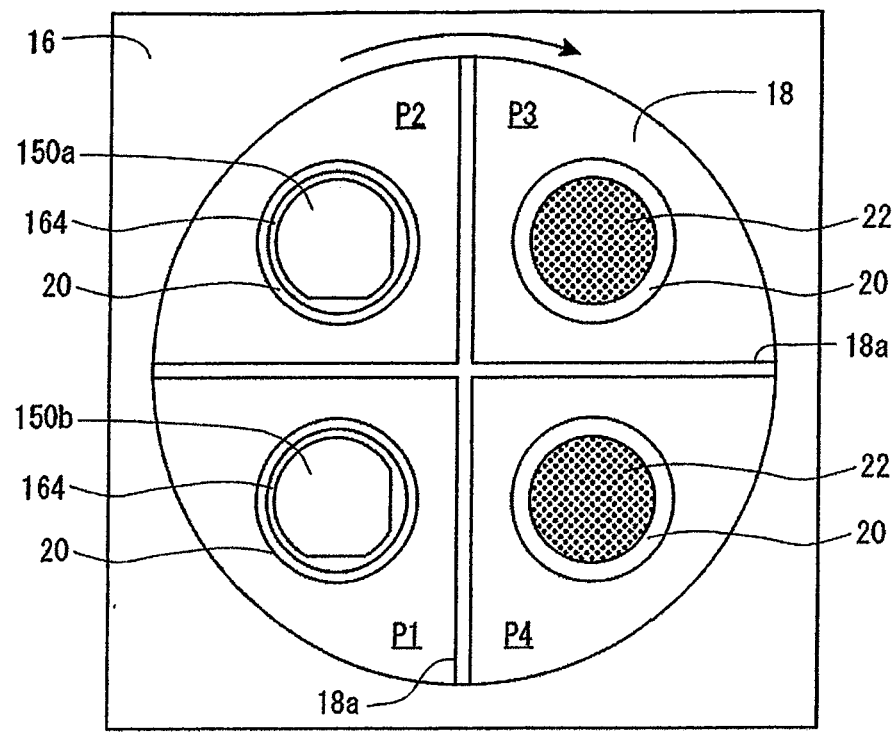
FIG. 14 is a plan view showing a condition where a first single crystal SiC ingot is set at a flattening position and a second single crystal SiC ingot is set at a standby position.

After performing the holding step, the turn table 18 is rotated by the turn table motor by 90 degrees in a clockwise direction as viewed in plan to thereby move the chuck table 20 holding the first ingot 150a from the standby position P1 to the flattening position P2 as shown in FIG. 14. In this stage, the first ingot 150a set at the flattening position P2 is not processed by a flattening step of grinding the upper surface of each ingot 150 held by the holding unit 4 to thereby flatten the upper surface of each ingot 150. That is, usually, the end surfaces of each ingot 150 (the first surface 152 and the second surface 154) have already been flattened to such an extent that the surface roughness does not interfere with the incidence of a laser beam in a separation layer forming step to be hereinafter described. Accordingly, the flattening step may not be performed to each ingot 150 first transferred from the ingot storing unit 132 to the chuck table 20 set at the standby position P1 and next moved to the flattening position P2. In concert with the movement of the first ingot 150a from the standby position P1 to the flattening position P2, the ingot transfer step and the holding step are performed for any arbitrary one of the remaining three ingots 150 stored in the ingot storing unit 132 (this arbitrary ingot 150 will be hereinafter referred to as "second ingot 150b"). That is, the ingot transfer unit 134 is operated to transfer the second ingot 150b from the ingot storing unit 132 to the chuck table 20 set at the standby position P1, and the holding unit 4 is next operated to hold the second ingot 150b on the chuck table 20 under suction. In FIG. 14, the orientation of the first ingot 150a set at the flattening position P2 is the same as the orientation of the second ingot 150b set at the standby position P1 for convenience of illustration. However, by the rotation of the turn table 18 and the rotation of each chuck table 20, the orientation of the ingot 150 held on each chuck table 20 becomes arbitrary. This point is similarly applied to FIG. 15 and the other similar figures.

Figure 15:
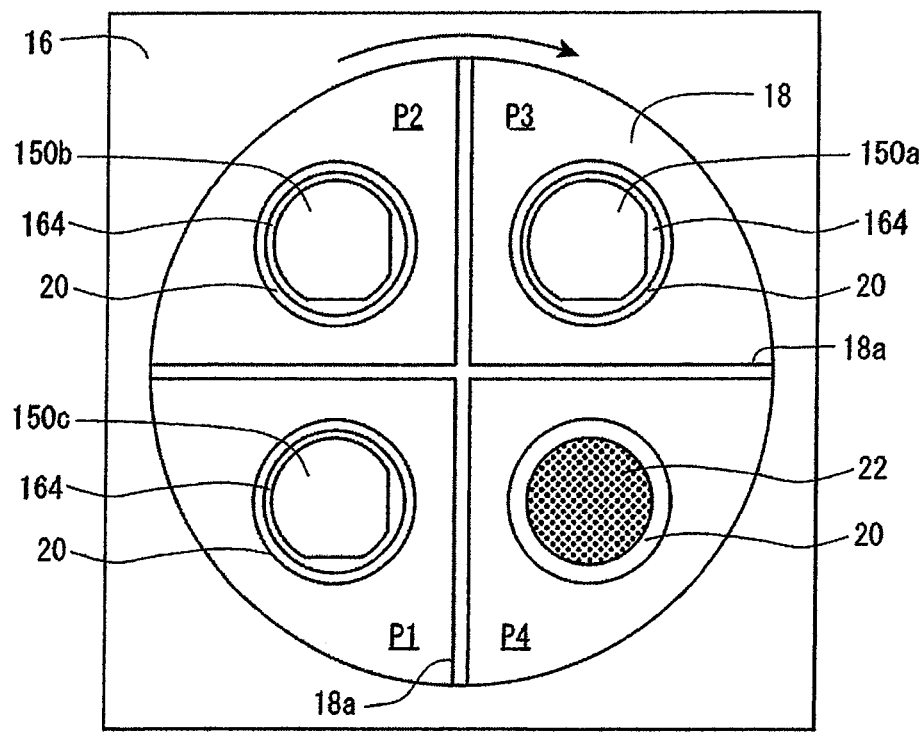
FIG. 15 is a plan view showing a condition where the first ingot is set at a separation layer forming position, the second ingot is set at the flattening position, and a third single crystal SiC ingot is set at the standby position.

After performing the ingot transfer step and the holding step for the second ingot 150b, the turn table 18 is rotated by the turn table motor by 90 degrees in a clockwise direction as viewed in plan. Accordingly, as shown in FIG. 15, the chuck table 20 holding the first ingot 150a is moved from the flattening position P2 to the separation layer forming position P3, and the chuck table 20 holding the second ingot 150b is moved from the standby position P1 to the flattening position P2. Thereafter, the first ingot 150a is processed by a separation layer forming step using the laser applying unit 8, in which the separation layer forming step is performed in such a manner that the focal point of the laser beam having a transmission wavelength to each ingot 150 is set at a predetermined depth from the upper surface of each ingot 150 held by the holding unit 4, the predetermined depth corresponding to the thickness of the wafer to be produced, and the laser beam is next applied to each ingot 150 to thereby form a separation layer. On the other hand, the second ingot 150b may not be processed by the flattening step, because the second ingot 150b is first transferred from the ingot storing unit 132 to the chuck table 20 set at the standby position P1 and next moved to the flattening position P2. In concert with the movement of the second ingot 150b from the standby position P1 to the flattening position P2, the ingot transfer step and the holding step are performed for any arbitrary one of the remaining two ingots 150 stored in the ingot storing unit 132 (this arbitrary ingot 150 will be hereinafter referred to as "third ingot 150c"). That is, the ingot transfer unit 134 is operated to transfer the third ingot 150c from the ingot storing unit 132 to the chuck table 20 set at the standby position P1, and the holding unit 4 is next operated to hold the third ingot 150c on the chuck table 20 under suction.

The separation layer forming step using the laser applying unit 8 will now be described. In the separation layer forming step, the X moving mechanism 76 of the laser applying unit 8 (see FIGS. 5 and 6) is operated to move the X movable plate 74 in the X direction and the Y moving mechanism 64 is operated to move the Y movable member 62 in the Y direction, thereby positioning the alignment unit 88 directly above each ingot 150. Thereafter, the alignment unit 88 is operated to image the ingot 150 from the upper side thereof. Thereafter, according to an image of the ingot 150 as obtained by the alignment unit 88, the chuck table 20 is rotated by the chuck table motor, and the X movable plate 74 is moved in the X direction by the X moving mechanism 76. Further, the Y movable member 62 is moved in the Y direction by the Y moving mechanism 64. Accordingly, the orientation of the ingot 150 is adjusted to a predetermined orientation, and the positional relation between the focusing means 86 and the ingot 150 in the XY plane is adjusted.

Figure 16A:
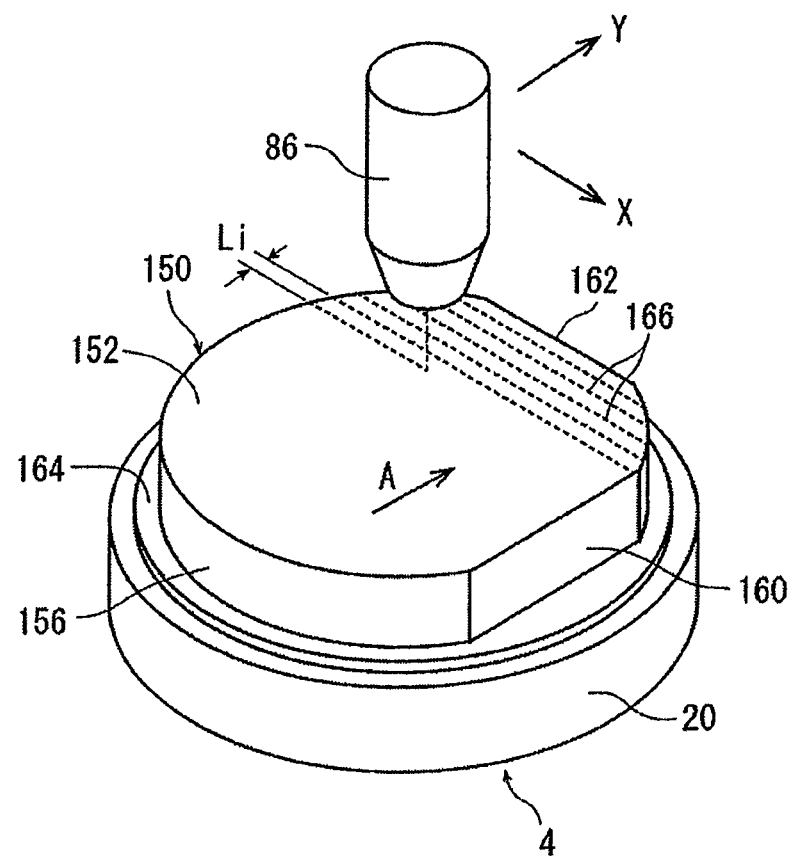
FIG. 16A is a perspective view showing a separation layer forming step.
Figure 16B:
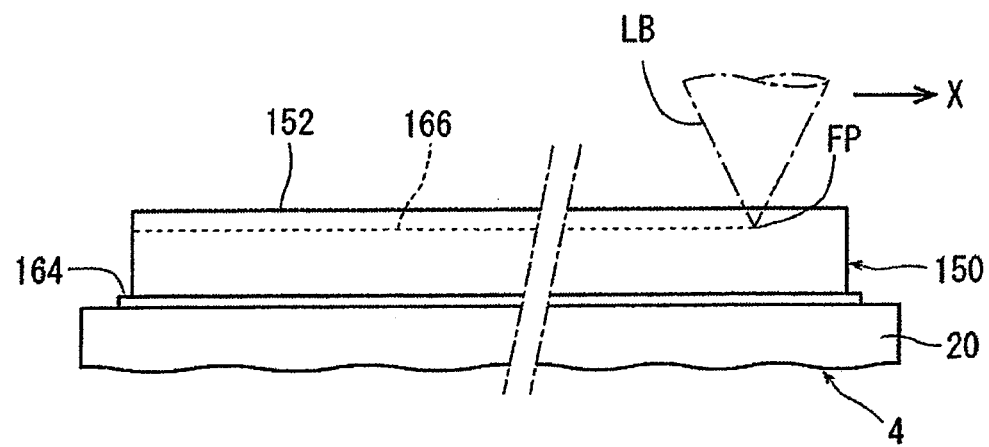
FIG. 16B is an elevational view showing the separation layer forming step shown in FIG. 16A.

In adjusting the orientation of the ingot 150 to a predetermined orientation, the first orientation flat 160 is made parallel to the Y direction and the second orientation flat 162 is made parallel to the X direction as shown in FIG. 16A. Accordingly, the direction A of formation of the off angle α is made parallel to the Y direction, and the direction perpendicular to the direction A of formation of the off angle α is made parallel to the X direction. Thereafter, the focal position adjusting unit is operated to move the focusing means 86 in the Z direction, thereby setting a focal point FP at a predetermined depth from the upper surface of the ingot 150 (e.g., the first surface 152) as shown in FIG. 16B, in which this predetermined depth corresponds to the thickness of the wafer to be produced. Thereafter, a pulsed laser beam LB having a transmission wavelength to the ingot 150 is applied from the focusing means 86 to the ingot 150 as moving the X movable plate 74 by operating the X moving mechanism 76 to thereby move the focal point FP relative to the ingot 150 at a predetermined feed speed in the X direction parallel to the direction perpendicular to the direction A of formation of the off angle α (modified layer forming step).

Figure 17A:
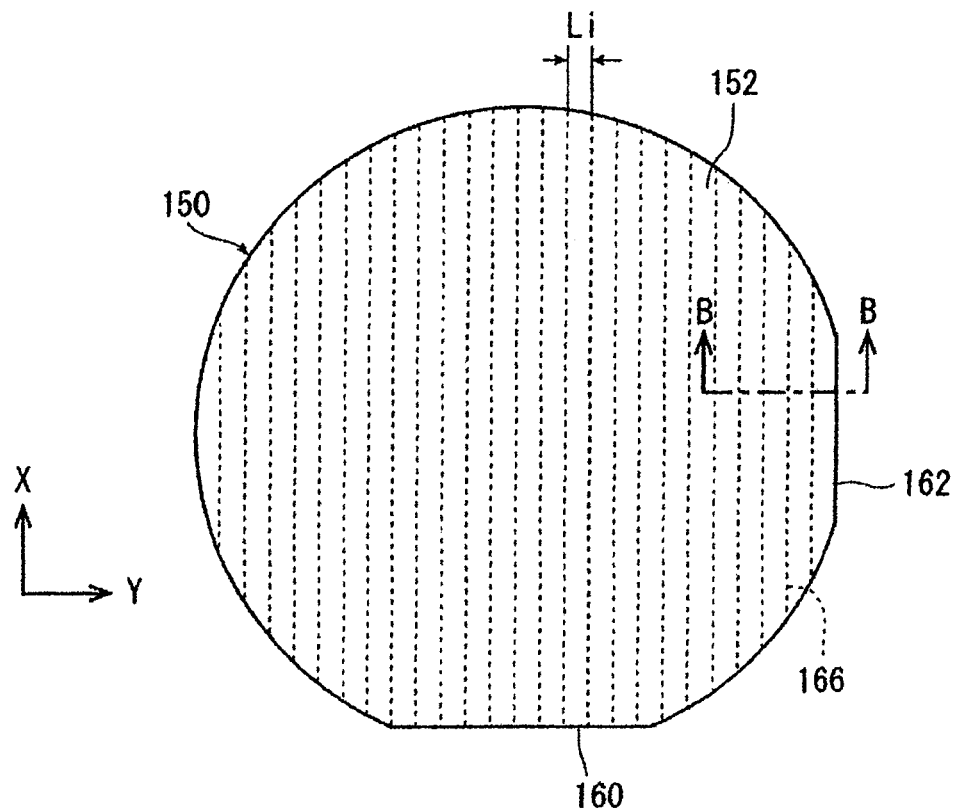
FIG. 17A is a plan view of the ingot in which a separation layer has been formed in the separation layer forming step.
Figure 17B:
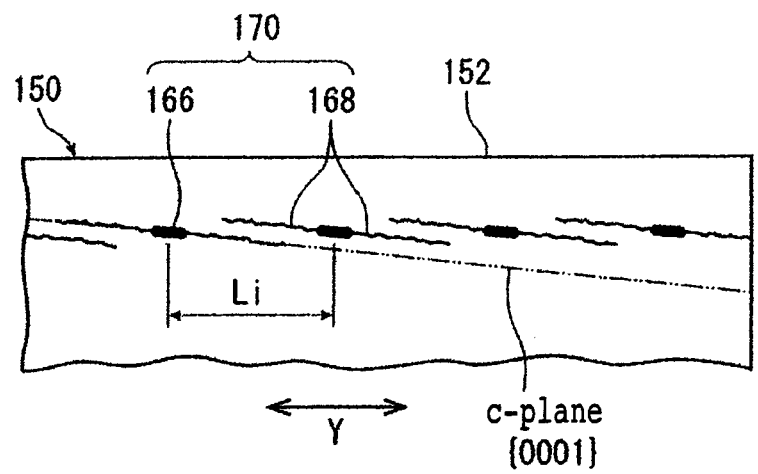
FIG. 17B is a cross section taken along the line B-B in FIG. 17A.

In the modified layer forming step, the pulsed laser beam LB is initially applied to the ingot 150 to thereby decompose SiC into Si (silicon) and C (carbon). Thereafter, the pulsed laser beam LB is next applied to the ingot 150 and absorbed by C previously produced. Thus, SiC is decomposed into Si and C in a chain reaction manner with the movement of the focal point FP in the X direction to thereby linearly form a modified layer 166 extending in the X direction as shown in FIGS. 17A and 17B. At the same time, cracks 168 are also formed so as to propagate from the modified layer 166 in opposite directions along the c-plane as shown in FIGS. 17A and 17B. In the modified layer forming step, the focal point FP is fed in the X direction relative to the ingot 150 so that the adjacent spots of the pulsed laser beam LB applied to the ingot 150 are overlapped with each other at the depth where the modified layer 166 is formed (i.e., a plurality of circular modified portions are overlapped with each other to form the linear modified layer 166). Accordingly, the pulsed laser beam LB is applied again to the modified layer 166 (to the circular modified portion previously formed) where SiC has been decomposed into Si and C. In order to ensure that the adjacent spots of the pulsed laser beam LB are overlapped with each other in the modified layer forming step, the relation of $G=(V/F)-D<0$ must hold, where F is the repetition frequency of the pulsed laser beam LB, V is the feed speed of the focal point FP, and D is the diameter of each spot. Further, the overlap rate of the adjacent spots is defined as $|G|/D$.

The separation layer forming step will further be described with reference to FIGS. 16A to 17B. After performing the modified layer forming step along a line in the X direction, an indexing step is performed in such a manner that the Y movable member 62 is moved by the Y moving mechanism 64 to thereby move the focal point FP relative to the ingot 150 by a predetermined index amount Li in the Y direction parallel to the direction A of formation of the off angle α. Thereafter, the modified layer forming step and the indexing step are repeated plural times to thereby form a plurality of linear modified layers 166 spaced from each other by the predetermined index amount Li in the direction A of formation of the off angle α (in the Y direction), in which each linear modified layer 166 extends in the direction perpendicular to the direction A of formation of the off angle α (in the X direction) as shown in FIG. 17A. Furthermore, the cracks 168 propagating from each linear modified layer 166 and the cracks 168 propagating from its adjacent linear modified layer 166 are overlapped with each other in the direction A of formation of the off angle α (in the Y direction) as shown in FIG. 17B. Accordingly, a separation layer 170 for separating the wafer from the ingot 150 can be formed inside the ingot 150 at a predetermined depth from the upper surface of the ingot 150, the predetermined depth corresponding to the thickness of the wafer to be produced, in which the separation layer 170 is composed of the plural linear modified layers 166 and the cracks 168 propagating therefrom as shown in FIG. 17B. For example, the separation layer forming step for forming the separation layer 170 inside the ingot 150 may be performed under the following processing conditions.

Figure 18:
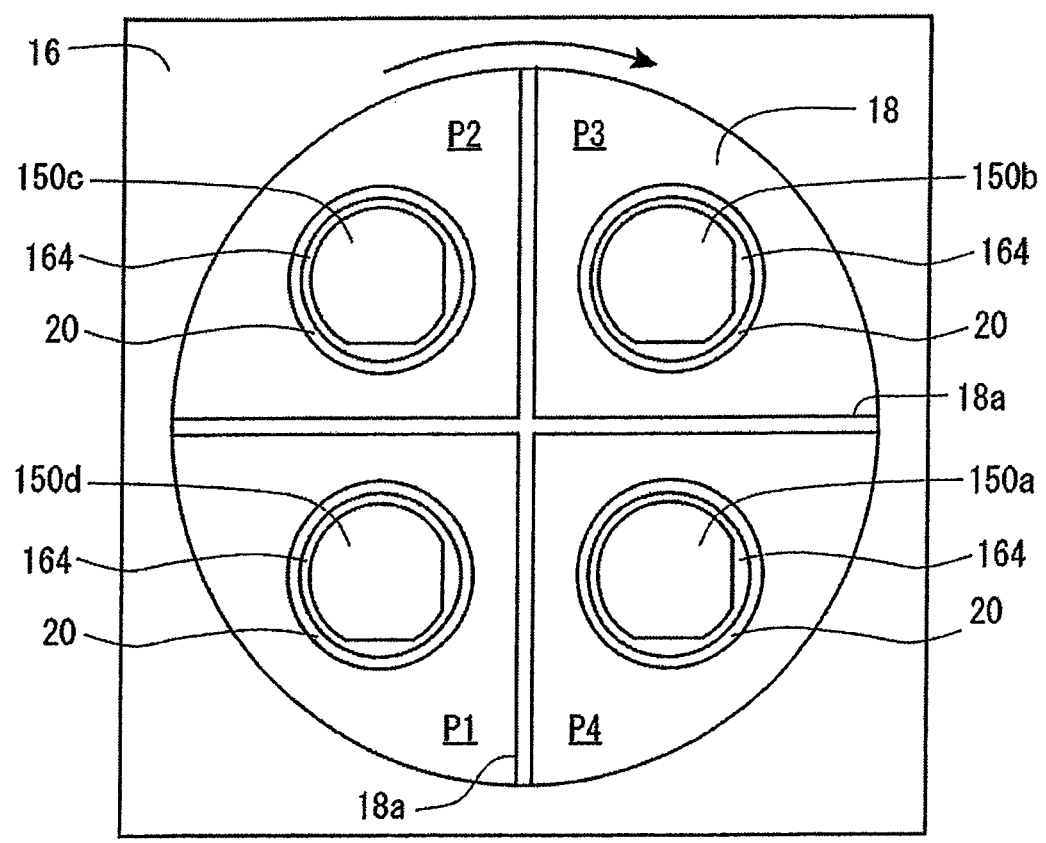
FIG. 18 is a plan view showing a condition where the first ingot is set at a wafer separating position, the second ingot is set at the separation layer forming position, the third ingot is set at the flattening position, and a fourth single crystal SiC ingot is set at the standby position.

Wavelength of the pulsed laser beam: 1064 nm
Repetition frequency: 80 kHz
Average power: 3.2 W
Pulse width: 4 ns
Diameter of the focal point: 3 μm
Numerical aperture (NA) of the focusing lens: 0.43
Z position of the focal point: 300 μm in depth from the upper surface of the ingot
Feed speed of the focal point: 120 to 260 mm/second
Index amount: 250 to 400 μm After performing the separation layer forming step for the first ingot 150a and performing the ingot transfer step and the holding step for the third ingot 150c, the turn table 18 is rotated by the turn table motor by 90 degrees in a clockwise direction as viewed in plan. Accordingly, as shown in FIG. 18, the chuck table 20 holding the first ingot 150a in which the separation layer 170 has been formed is moved from the separation layer forming position P3 to the wafer separating position P4. At the same time, the chuck table 20 holding the second ingot 150b is moved from the flattening position P2 to the separation layer forming position P3, and the chuck table 20 holding the third ingot 150c is moved from the standby position P1 to the flattening position P2. At the wafer separating position P4, the first ingot 150a is processed by a wafer separating step using the wafer separating unit 10, in which the wafer separating step is performed in such a manner that the upper surface of each ingot 150 is held under suction to separate the wafer from the ingot 150 along the separation layer 170. Further, the second ingot 150b is processed by the separating layer forming step using the laser applying unit 8. On the other hand, the third ingot 150c may not be processed by the flattening step, because the third ingot 150c is first transferred from the ingot storing unit 132 to the chuck table 20 set at the standby position P1 and next moved to the flattening position P2. In concert with the movement of the third ingot 150c from the standby position P1 to the flattening position P2, the ingot transfer step and the holding step are performed for the remaining one ingot 150 stored in the ingot storing unit 132 (this remaining one ingot 150 will be hereinafter referred to as "fourth ingot 150d"). That is, the ingot transfer unit 134 is operated to transfer the fourth ingot 150d from the ingot storing unit 132 to the chuck table 20 set at the standby position P1, and the holding unit 4 is next operated to hold the fourth ingot 150d on the chuck table 20 under suction.

Figure 19A:
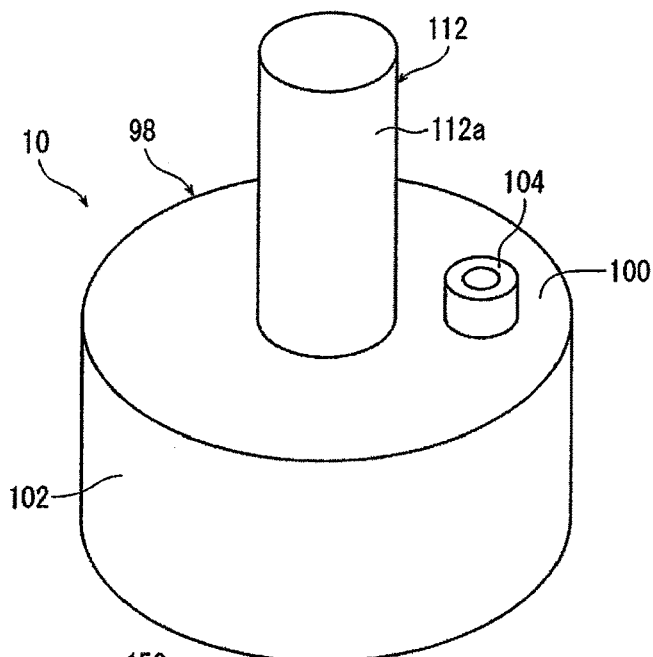
FIG. 19A is a perspective view showing a condition where a liquid tank is positioned directly above a chuck table in a wafer separating step.
Figure 19B:
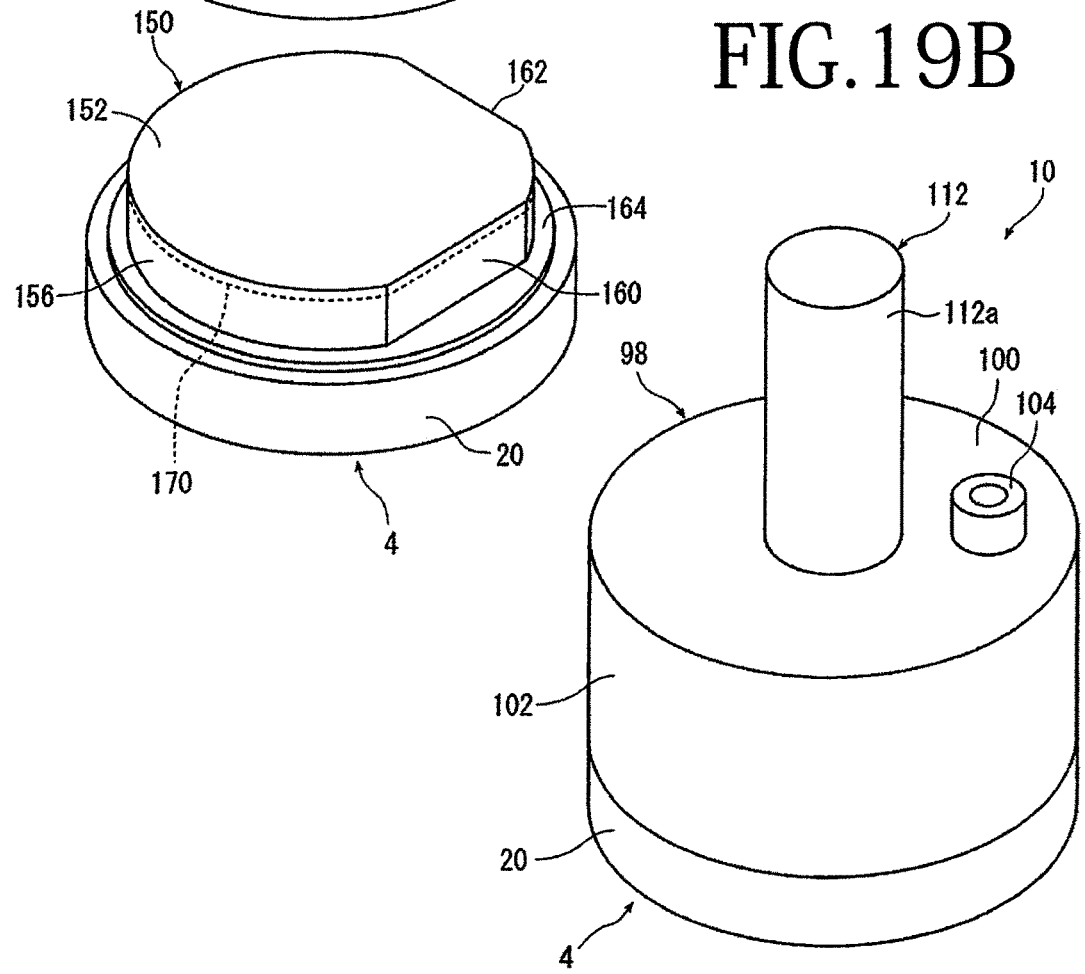
FIG. 19B is a view similar to FIG. 19A, showing a condition where the lower surface of the liquid tank is in contact with the upper surface of the chuck table in the wafer separating step.
Figure 20:
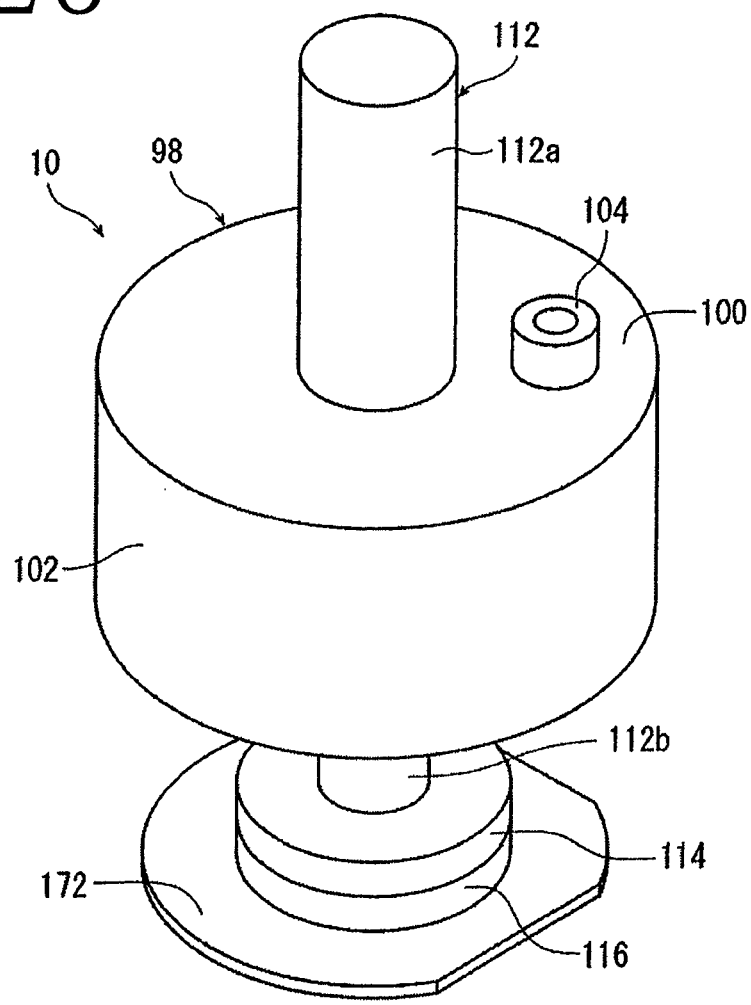
FIG. 20 is a perspective view showing a condition where an SiC wafer has been separated from the ingot by the wafer separating unit.
Figure 20:
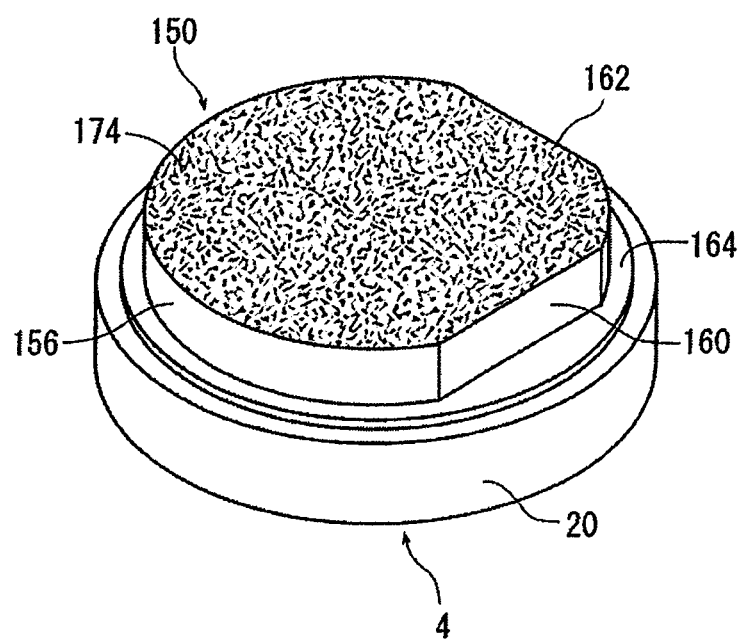

The wafer separating step using the wafer separating unit 10 will now be described with reference to FIGS. 9, 19A, 19B, and 20. In the wafer separating step, the arm moving mechanism 94 is operated to lower the arm 92 and bring the lower end of the side wall 102 of the liquid tank 98 into close contact with the upper surface of the chuck table 20 holding the ingot 150 in which the separation layer 170 has been formed as shown in FIGS. 19A and 19B. Thereafter, as shown in FIG. 9, the air cylinder 112 of the wafer separating unit 10 is operated to lower the piston rod 112b and bring the lower surface of the suction member 116 into close contact with the upper surface of the ingot 150. Thereafter, the suction unit connected to the suction member 116 is operated to apply a suction force to the lower surface of the suction member 116, so that the upper surface of the ingot 150 is held by the lower surface of the suction member 116 under suction. Thereafter, the liquid supply unit connected to the liquid inlet portion 104 is operated to supply the liquid 110 (e.g., water) from the liquid inlet portion 104 into the liquid storing space 108 until the ultrasonic vibration generating member 114 is immersed in the liquid 110. Thereafter, the ultrasonic vibration generating member 114 is operated to apply ultrasonic vibration to the ingot 150, so that an SiC wafer 172 to be produced can be separated from the ingot 150 along the separation layer 170 as a separation start point. Thereafter, the arm moving mechanism 94 is operated to raise the arm 92, thereby separating the liquid tank 98 from the chuck table 20, so that the liquid 110 is discharged from the liquid storing space 108. The liquid 110 discharged from the liquid storing space 108 is drained through a drain opening 16a (see FIG. 2) to the outside of the wafer producing apparatus 2, in which the drain opening 16a is formed in the turn table accommodating portion 16 of the base 14 at a position adjacent to the wafer separating unit 10. Thereafter, as shown in FIG. 20, the air cylinder 112 is operated to lower the piston rod 112b until the wafer 172 produced from the ingot 150 projects downward from the lower end of the side wall 102 of the liquid tank 98. As shown in FIG. 20, after separating the wafer 172 from the ingot 150, the upper surface of the ingot 150 becomes a rough separation surface 174. The height of the roughness of the rough separation surface 174 is approximately 100 μm, for example.

After performing the wafer separating step for the first ingot 150a, a wafer transfer step is performed by using the wafer transfer unit 118 in such a manner that the wafer 172 produced from the first ingot 150a is transferred from the wafer separating unit 10 to the wafer storing unit 12. In the wafer transfer step, the first arm 124 is operated by the first motor 122 of the wafer transfer unit 118, and the second arm 128 is operated by the second motor 126 of the wafer transfer unit 118 to thereby position the suction member 130 of the wafer transfer unit 118 directly below the wafer 172 held by the suction member 116 of the wafer separating unit 10 after separating the wafer 172 from the first ingot 150a. Thereafter, the elevating unit 120 of the wafer transfer unit 118 is operated to bring the upper surface of the suction member 130 of the wafer transfer unit 118 into close contact with the lower surface of the wafer 172. Thereafter, the operation of the suction unit connected to the suction member 116 of the wafer separating unit 10 is stopped to remove the suction force applied to the suction member 116. Thereafter, the suction unit connected to the suction member 130 of the wafer transfer unit 118 is operated to apply a suction force to the upper surface of the suction member 130, thereby holding the lower surface of the wafer 172 on the upper surface of the suction member 130 under suction. Thusly, the wafer 172 is received by the wafer transfer unit 118 from the wafer separating unit 10. Thereafter, the elevating unit 120, the first motor 122, and the second motor 126 are operated to move the first arm 124 and the second arm 128, thereby transferring the wafer 172 held by the suction member 130 from the wafer separating unit 10 to the wafer storing unit 12 and then storing the wafer 172 into the wafer storing unit 12.

Figure 21:
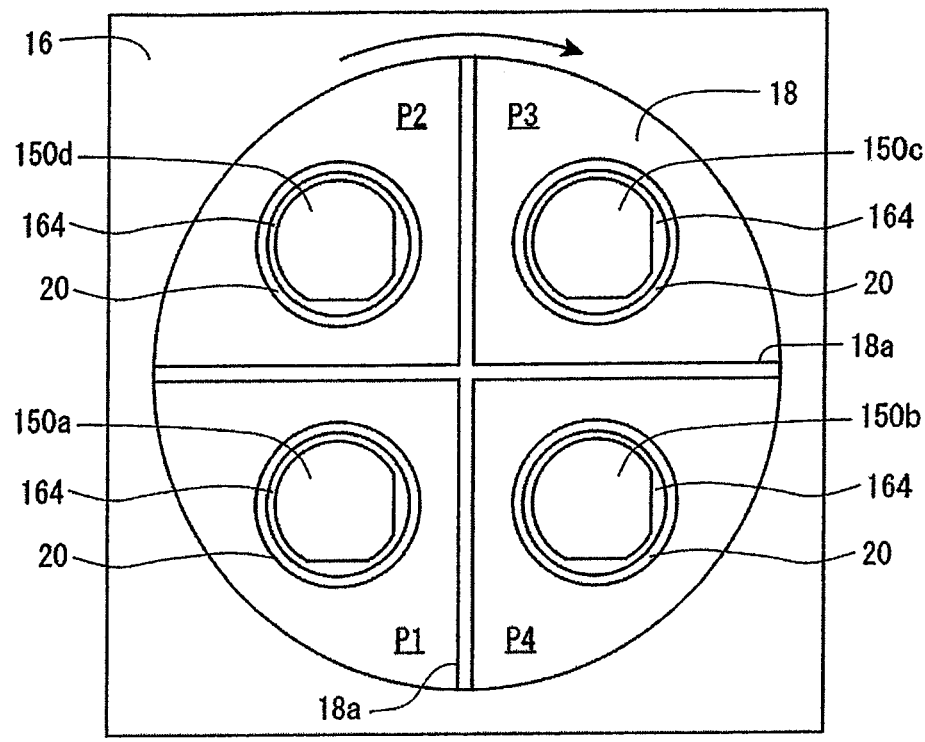
FIG. 21 is a plan view showing a condition where the first ingot is set at the standby position, the second ingot is set at the wafer separating position, the third ingot is set at the separation layer forming position, and the fourth ingot is set at the flattening position.

After performing the wafer separating step for the first ingot 150a, performing the wafer transfer step for the wafer 172 produced from the first ingot 150*a*, performing the separation layer forming step for the second ingot 150*b*, and performing the ingot transfer step and the holding step for the fourth ingot 150*d*, the turn table 18 is rotated by the turn table motor by 90 degrees in a clockwise direction as viewed in plan. Accordingly, as shown in FIG. 21, the chuck table 20 holding the first ingot 150*a* is moved from the wafer separating position P4 to the standby position P1, the chuck table 20 holding the second ingot 150*b* is moved from the separation layer forming position P3 to the wafer separating position P4, the chuck table 20 holding the third ingot 150*c* is moved from the flattening position P2 to the separation layer forming position P3, and the chuck table 20 holding the fourth ingot 150*d* is moved from the standby position P1 to the flattening position P2. Thereafter, the wafer separating step is performed for the second ingot 150*b* by using the wafer separating unit 10, and the wafer transfer step is performed for the wafer 172 produced from the second ingot 150*b*, by using the wafer transfer unit 118. Further, the separation layer forming step is performed for the third ingot 150*c* by using the laser applying unit 8. On the other hand, the flattening step may not be performed for the fourth ingot 150*d*, because the fourth ingot 150*d* is first transferred from the ingot storing unit 132 to the chuck table 20 set at the standby position P1 and next moved to the flattening position P2. The first ingot 150*a* moved from the wafer separating position P4 to the standby position P1 waits at the standby position P1 until the turn table 18 is next rotated.

Figure 22:
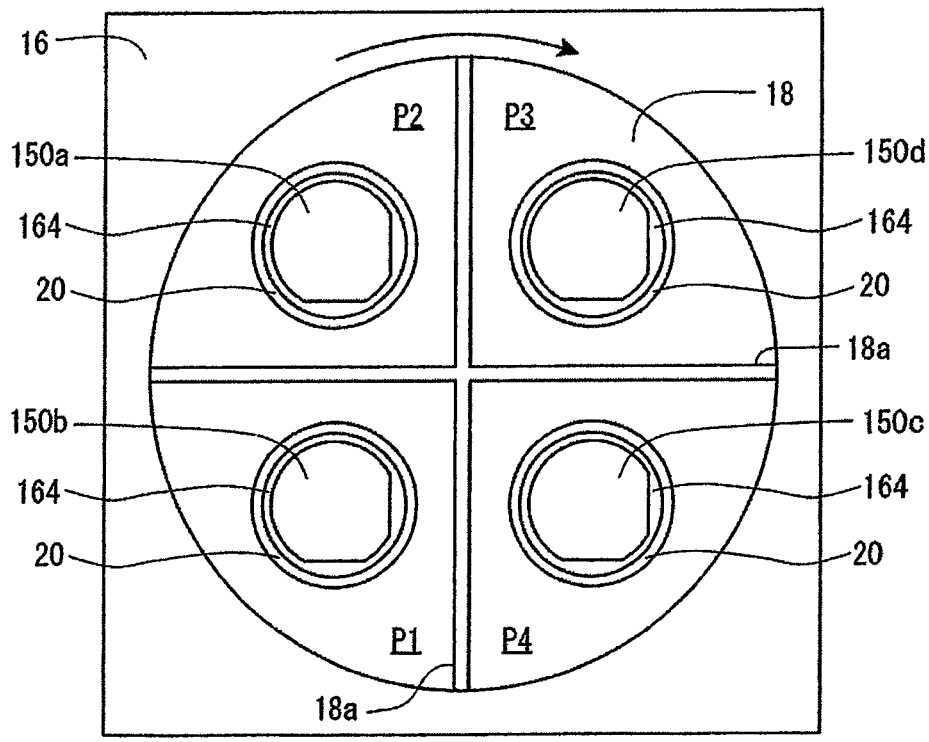
FIG. 22 is a plan view showing a condition where the first ingot is set at the flattening position, the second ingot is set at the standby position, the third ingot is set at the wafer separating position, and the fourth ingot is set at the separation layer forming position.

After performing the wafer separating step for the second ingot 150*b*, performing the wafer transfer step for the wafer 172 produced from the second ingot 150*b*, and performing the separation layer forming step for the third ingot 150*c*, the turn table 18 is rotated by the turn table motor by 90 degrees in a clockwise direction as viewed in plan. Accordingly, as shown in FIG. 22, the chuck table 20 holding the first ingot 150*a* is moved from the standby position P1 to the flattening position P2, the chuck table 20 holding the second ingot 150*b* is moved from the wafer separating position P4 to the standby position P1, the chuck table 20 holding the third ingot 150*c* is moved from the separation layer forming position P3 to the wafer separating position P4, and the chuck table 20 holding the fourth ingot 150*d* is moved from the flattening position P2 to the separation layer forming position P3. The flattening step using the flattening unit 6 is performed for the first ingot 150*a* in such a manner that the upper surface of the ingot 150 held by the holding unit 4 is ground to be flattened. The wafer separating step is performed for the third ingot 150*c* by using the wafer separating unit 10. The wafer transfer step using the wafer transfer unit 118 is performed for the wafer 172 produced from the third ingot 150*c*. The separation layer forming step using the laser applying unit 8 is performed for the fourth ingot 150*d*. The second ingot 150*b* moved from the wafer separating position P4 to the standby position P1 waits at the standby position P1 until the turn table 18 is next rotated.

The flattening step using the flattening unit 6 will now be described with reference to FIGS. 2 and 3. In the flattening step, the chuck table 20 holding the ingot 150 from which the wafer 172 has been separated is rotated by the chuck table motor at a predetermined speed (e.g., 300 rpm) in a counterclockwise direction as viewed in plan. Further, the spindle 40 of the flattening unit 6 is rotated by the motor 36 at a predetermined speed (e.g., 6000 rpm) in a counterclockwise direction as viewed in plan. Thereafter, the Z moving mechanism 28 of the flattening unit 6 is operated to lower the Z movable plate 26 and bring the abrasive members 48 into contact with the separation surface 174 of the ingot 150.

After the abrasive members 48 come into contact with the separation surface 174, the Z movable plate 26 is lowered by the Z moving mechanism 28 at a predetermined feed speed (e.g., 1.0 µm/second). Accordingly, the separation surface 174 of the ingot 150 from which the wafer 172 has been separated is ground by the abrasive members 48 and thereby flattened to such an extent that the surface roughness of the upper surface of the ingot 150 does not interfere with the incidence of the pulsed laser beam LB in the separation layer forming step. In grinding the separation surface 174 of the ingot 150 to flatten the same, a thickness gauge (not shown) may be used to measure the thickness of the ingot 150. In this case, the thickness gauge is brought into contact with the separation surface 174 of the ingot 150, and it is detected that the thickness of the ingot 150 measured by the thickness gauge has been reduced by a predetermined amount (e.g., 100 µm corresponding to the height of the roughness of the separation surface 174). As a result, it is possible to detect that the upper surface of the ingot 150 has been suitably flattened. Further, in the flattening step, a grinding water is supplied from a grinding water supply unit (not shown) to a grinding area in grinding the separation surface 174 of the ingot 150. The grinding water supplied to the grinding area is drained through a drain opening 16*b* (see FIG. 2) to the outside of the wafer producing apparatus 2, in which the drain opening 16*b* is formed in the turn table accommodating portion 16 of the base 14 at a position adjacent to the flattening unit 6.

Figure 23:
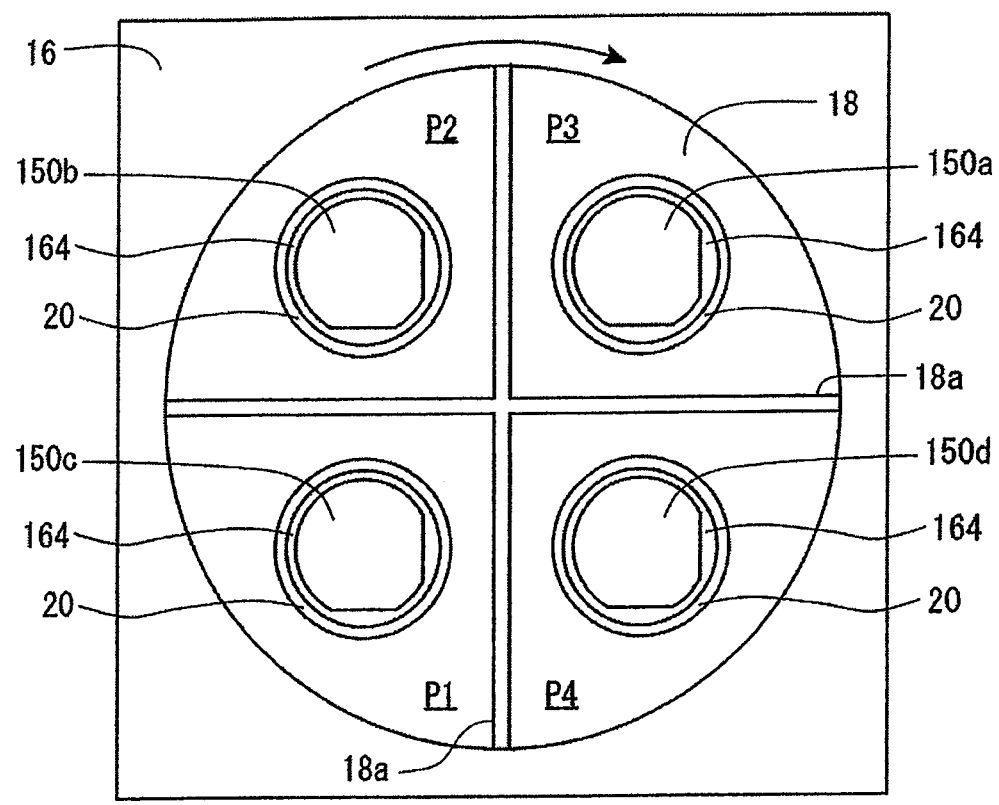
FIG. 23 is a plan view showing a condition where the first ingot is set at the separation layer forming position, the second ingot is set at the flattening position, the third ingot is set at the standby position, and the fourth ingot is set at the wafer separating position.

After performing the flattening step for the first ingot 150*a*, performing the wafer separating step for the third ingot 150*c*, performing the wafer transfer step for the wafer 172 produced from the third ingot 150*c*, and performing the separation layer forming step for the fourth ingot 150*d*, the turn table 18 is rotated by the turn table motor by 90 degrees in a clockwise direction as viewed in plan. Accordingly, as shown in FIG. 23, the chuck table 20 holding the first ingot 150*a* is moved from the flattening position P2 to the separation layer forming position P3, the chuck table 20 holding the second ingot 150*b* is moved from the standby position P1 to the flattening position P2, the chuck table 20 holding the third ingot 150*c* is moved from the wafer separating position P4 to the standby position P1, and the chuck table 20 holding the fourth ingot 150*d* is moved from the separation layer forming position P3 to the wafer separating position P4. Just after performing the flattening step for the first ingot 150*a*, the cleaning unit 50 is operated to clean the first ingot 150*a* in the following manner as shown in FIG. 4. The cleaning water 55 is discharged obliquely downward toward the first ingot 150*a* from each nozzle hole of the first cleaning portion 54 to thereby remove a grinding dust from the first ingot 150*a*. Thereafter, the compressed air 57 is discharged downward from each nozzle hole of the second cleaning portion 56 to thereby remove the cleaning water 55 from the first ingot 150*a*. Thus, the first ingot 150*a* processed by the flattening unit 6 is cleaned and dried by the cleaning unit 50. After cleaning the first ingot 150*a*, the separation layer forming step is performed for the first ingot 150*a* by using the laser applying unit 8. Further, the flattening step is performed for the second ingot 150*b* by using the flattening unit 6. Further, the wafer separating step is performed for the fourth ingot 150*d* by using the wafer separating unit 10, and the wafer transfer step is performed for the wafer 172 produced from the fourth ingot 150*d*, by using the wafer transfer unit 118. Further, the third ingot 150*c* moved from the wafer separating position P4 to the standby position P1 waits at the standby position P1 until the turn table 18 is next rotated.

Thereafter, every time the turn table 18 is rotated by the turn table motor by 90 degrees in a clockwise direction as viewed in plan, each chuck table 20 is sequentially set at the standby position P1, the flattening position P2, the separation layer forming position P3, and the wafer separating position P4. Thereafter, the flattening step, the separation layer forming step, and the wafer separating step are repeatedly performed for each ingot 150 held on each chuck table 20. Further, the wafer transfer step is performed for each wafer 172 separated by the wafer separating unit 10. Accordingly, an obtainable number of wafers 172 are produced from each ingot 150, and the wafers 172 thus produced are stored into the wafer storing unit 12.

After producing an obtainable number of wafers 172 from each ingot 150, a substrate recovering step may be performed to recover the substrate 164 on which a part of the ingot 150 is slightly left. A suitable recovery container 176 (see FIGS. 1 and 2) for recovering the substrate 164 is located on the upper surface of the base 14 at the front end portion thereof in the vicinity of the ingot transfer unit 134. The substrate 164 is transferred to the substrate recovery container 176 by) the ingot transfer unit 134. More specifically, in the substrate recovering step, the arm moving mechanism 140 of the ingot transfer unit 134 is operated to move the arm 138 in the Y direction and thereby position the suction member 146 directly above the substrate 164 set at the standby position P1. Thereafter, the air cylinder 144 of the ingot transfer unit 134 is operated to lower the suction member 146 and bring the lower surface of the suction member 146 into close contact with the upper surface of the substrate 164. Thereafter, the suction unit connected to the suction member 146 is operated to apply a suction force to the lower surface of the suction member 146, thereby holding the upper surface of the substrate 164 on the lower surface of the suction member 146 under suction. Thereafter, the air cylinder 144 is operated to raise the suction member 146 holding the substrate 164. Thereafter, the arm moving mechanism 140 is operated to move the arm 138 in the Y direction and thereby position the suction member 146 directly above the recovery container 176. Thereafter, the operation of the suction unit connected to the suction member 146 is stopped to remove the suction force applied to the suction member 146, thereby storing the substrate 164 into the recovery container 176. Thereafter, the turn table 18 is rotated by the turn table motor to sequentially move the substrate 164 to the standby position P1. Thereafter, the above substrate recovering step may be similarly performed for each substrate 164. Thus, all of the substrates 164 may be recovered into the recovery container 176.

According to the above preferred embodiment, the wafer producing apparatus 2 includes the holding unit 4 for holding the ingot 150, the flattening unit 6 for grinding the upper surface of the ingot 150 held by the holding unit 4, thereby flattening the upper surface of the ingot 150, the laser applying unit 8 for setting the focal point FP of the pulsed laser beam LB having a transmission wavelength to the ingot 150 inside the ingot 150 at a predetermined depth from the upper surface of the ingot 150 held by the holding unit 4, the predetermined depth corresponding to the thickness of the wafer 172 to be produced, and next applying the pulsed laser beam LB to the ingot 150 to thereby form the separation layer 170 for separating the wafer 172 from the ingot 150, the wafer separating unit 10 for holding the upper surface of the ingot 150 to separate the wafer 172 from the ingot 150 along the separation layer 170, and the wafer storing unit 12 for storing the wafer 172 separated from the ingot 150. Accordingly, by sequentially performing the separation layer forming step, the wafer separating step, the wafer transfer step, and the flattening step, the wafer 172 can be automatically produced from the ingot 150 and then stored into the wafer storing unit 12, so that the production efficiency can be improved.

In this preferred embodiment, the wafer producing apparatus 2 further includes the ingot storing unit 132 for storing the ingot 150 and the ingot transfer unit 134 for transferring the ingot 150 from the ingot storing unit 132 to the holding unit 4. Accordingly, by operating the wafer producing apparatus 2 in the condition where the ingot 150 is stored in the ingot storing unit 132, the ingot transfer step of transferring the ingot 150 from the ingot storing unit 132 to the holding unit 4 can also be automated.

In this preferred embodiment, the wafer producing apparatus 2 further includes the cleaning unit 50 for cleaning the ingot 150 processed by the flattening unit 6. Accordingly, by operating the cleaning unit 50 in grinding the separation surface 174 of the ingot 150 in the flattening step, it is possible to prevent the possibility that the grinding dust generated in the flattening step or the grinding water supplied to the grinding area may be scattered to the laser applying unit 8. Further, in rotating the turn table 18 after performing the flattening step, the ingot 150 processed in the flattening step can be cleaned by the cleaning unit 50.

In this preferred embodiment, the four chuck tables 20 constituting the holding unit 4 are provided on the turn table 18. By the rotation of the turn table 18, each chuck table 20 can be positioned sequentially below the flattening unit 6, the laser applying unit 8, and the wafer separating unit 10. Accordingly, a plurality of ingots can be simultaneously processed by different steps (essentially, the flattening step, the separation layer forming step, and the wafer separating step), so that a plurality of steps can be performed efficiently.

In the separation layer forming step in the above preferred embodiment, the focal point FP is moved relative to the ingot 150 in the direction perpendicular to the direction A of formation of the off angle α in the modified layer forming step, and the focal point FP is moved relative to the ingot 150 in the direction A of formation of the off angle α in the indexing step. As a modification, the direction of movement of the focal point FP relative to the ingot 150 in the modified layer forming step may not be the direction perpendicular to the direction A of formation of the off angle α, and the direction of movement of the focal point FP relative to the ingot 150 in the indexing step may not be the direction A of formation of the off angle α. Further, the wafer producing apparatus 2 may include a wafer grinding unit for grinding a separation surface of the wafer 172 separated from the ingot 150 by the wafer separating unit 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing apparatus for producing an SiC wafer from a single crystal SiC ingot, said wafer producing apparatus comprising:
   a holding unit for holding said ingot;
   a flattening unit for grinding the upper surface of said ingot held by said holding unit, thereby flattening the upper surface of said ingot;
   a laser applying unit for setting the focal point of a laser beam having a transmission wavelength, the laser beam being focused at a focal point inside said ingot, wherein the focal point is at a predetermined depth from the upper surface of said ingot held by said holding unit, said predetermined depth corresponding to the thickness of said wafer to be produced, and for applying said laser beam to said ingot to thereby form a separation layer for separating said wafer from said ingot;

a wafer separating unit for holding the upper surface of said ingot to separate said wafer from said ingot along said separation layer; and a wafer storing unit for storing said wafer separated from said ingot.

2. The wafer producing apparatus according to claim 1, further comprising:

an ingot storing unit for storing said ingot; and an ingot transfer unit for transferring said ingot from said ingot storing unit to said holding unit.

3. The wafer producing apparatus according to claim 1, further comprising:

a cleaning unit for cleaning said ingot processed by said flattening unit.

4. The wafer producing apparatus according to claim 1, wherein said holding unit is provided on a turn table, so that when said turn table is rotated, said holding unit is positioned sequentially below said flattening unit, said laser applying unit, and said wafer separating unit.

5. The wafer producing apparatus according to claim 4, further comprising four circular chuck tables rotatably provided on an upper surface of said turn table.

6. The wafer producing apparatus according to claim 1, wherein said wafer separating unit includes an ultrasonic vibration generating member configured for generating an ultrasonic vibration and applying the ultrasonic vibration to said ingot to separate said wafer from said ingot.

7. The wafer producing apparatus according to claim 1, wherein said wafer storing unit includes a cassette that is configured to store said wafer separated from said ingot and at least one additional wafer separated from said ingot.

* * * * *